US009275855B2

(12) United States Patent
Kawashima et al.

(10) Patent No.: US 9,275,855 B2
(45) Date of Patent: Mar. 1, 2016

(54) SEMICONDUCTOR THIN-FILM FORMING METHOD, SEMICONDUCTOR DEVICE, SEMICONDUCTOR DEVICE MANUFACTURING METHOD, SUBSTRATE, AND THIN-FILM SUBSTRATE

(71) Applicant: JOLED INC., Tokyo (JP)

(72) Inventors: Takahiro Kawashima, Osaka (JP); Hikaru Nishitani, Nara (JP); Sei Ootaka, Kyoto (JP)

(73) Assignee: JOLED INC., Tokyo (JP)

( * ) Notice: Subject to any disclaimer, the term of this patent is extended or adjusted under 35 U.S.C. 154(b) by 207 days.

(21) Appl. No.: 13/625,380

(22) Filed: Sep. 24, 2012

(65) Prior Publication Data

US 2013/0026479 A1 Jan. 31, 2013

Related U.S. Application Data

(63) Continuation of application No. PCT/JP2012/000753, filed on Feb. 3, 2012.

(30) Foreign Application Priority Data

Mar. 22, 2011 (JP) ................... 2011-063346
Aug. 29, 2011 (JP) ................... 2011-186570

(51) Int. Cl.
*H01L 21/326* (2006.01)
*H01L 21/479* (2006.01)
(Continued)

(52) U.S. Cl.
CPC ...... *H01L 21/02422* (2013.01); *H01L 21/0262* (2013.01); *H01L 21/02532* (2013.01); *H01L 21/02667* (2013.01); *H01L 27/1222* (2013.01); *H01L 27/1285* (2013.01); *H01L 29/66757* (2013.01); *H01L 29/66765* (2013.01); *H01L 29/78675* (2013.01); *H01L 29/78678* (2013.01)

(58) Field of Classification Search
CPC .......... H01L 21/02422; H01L 29/78678; H01L 27/1222; H01L 27/1285; H01L 29/66765; H01L 29/78675; H01L 29/66757; H01L 21/0262; H01L 21/02667; H01L 21/02532
See application file for complete search history.

(56) References Cited

U.S. PATENT DOCUMENTS 4,690,797 A 9/1987 Eyer et al.
5,677,236 A * 10/1997 Saitoh et al. .............. 438/485
(Continued)

FOREIGN PATENT DOCUMENTS

EP 0473988 A1 3/1992
JP 61-153277 7/1986
(Continued)

OTHER PUBLICATIONS

International Search Report in International Application No. PCT/JP2012/000753, dated Apr. 3, 2012.
(Continued)

*Primary Examiner* — Jarrett Stark
(74) *Attorney, Agent, or Firm* — Greenblum & Bernstein, P.L.C.

(57) ABSTRACT

A semiconductor thin-film manufacturing method includes: forming, above a substrate, an amorphous silicon film (precursor film) having a photoluminescence (PL) intensity greater than or equal to 0.65 when photon energy is 1.1 eV in a PL spectrum normalized to have a maximum PL intensity of 1; and annealing the amorphous silicon film to form a crystalline silicon film.

14 Claims, 26 Drawing Sheets

(51) Int. Cl.
*H01L 21/02* (2006.01)
*H01L 29/66* (2006.01)
*H01L 29/786* (2006.01)
*H01L 27/12* (2006.01)

(56) References Cited

U.S. PATENT DOCUMENTS

| | | | |
|---|---|---|---|
| 5,766,989 A * | 6/1998 | Maegawa et al. | 438/166 |
| 5,795,795 A | 8/1998 | Kousai et al. | |
| 5,827,773 A | 10/1998 | Voutsas | |
| 5,959,314 A | 9/1999 | Voutsas | |
| 6,143,661 A | 11/2000 | Kousai et al. | |
| 6,169,013 B1 | 1/2001 | Voutsas | |
| 6,329,270 B1 | 12/2001 | Voutsas | |
| 6,723,589 B2 * | 4/2004 | Lee | 438/155 |
| 6,743,700 B2 | 6/2004 | Asami et al. | |
| 7,384,828 B2 | 6/2008 | Asami et al. | |
| 8,124,972 B2 | 2/2012 | Dairiki et al. | |
| 2002/0182828 A1 | 12/2002 | Asami et al. | |
| 2005/0020037 A1 | 1/2005 | Asami et al. | |
| 2009/0029530 A1 | 1/2009 | Kunii | |
| 2009/0267068 A1 | 10/2009 | Dairiki et al. | |
| 2012/0309140 A1 | 12/2012 | Oda et al. | |

FOREIGN PATENT DOCUMENTS

| | | |
|---|---|---|
| JP | 62-089367 | 4/1987 |
| JP | 03-060016 | 3/1991 |
| JP | 04-022120 | 1/1992 |
| JP | 04-311039 | 11/1992 |
| JP | 06-342909 | 12/1994 |
| JP | 2000-232065 | 8/2000 |
| JP | 2002-313720 | 10/2002 |
| JP | 3535241 | 3/2004 |
| JP | 2007-173839 | 7/2007 |
| JP | 2008-166828 | 7/2008 |
| JP | 2009-032757 | 2/2009 |
| JP | 2010-109352 | 5/2010 |
| JP | 2010-153765 | 7/2010 |
| JP | 2010-199529 | 9/2010 |

OTHER PUBLICATIONS

Sumio IIJIMA, "Fine Particules of Silicon. I. Crystal Growth of Sperical Particles of Si", Japanese Journal of Applied Physics, vol. 26, No. 3, pp. 357-364 (Mar. 1987).

Huang-Chung Cheng et al., "Thin Film Transistors with Polycrystalline Silicon Films Prapared by Two-Step Rapid Thermal Annealing", Japanese Journal of Applied Physics, vol. 39, Part 2, No. 1A/B, pp. L19-L20 (Jan. 15, 2000).

English language Abstract of Japanese Patent Publication No. 08-148428, dated Jun. 7, 1996.

* cited by examiner (SEM image)

(Schematic diagram)

FIG. 2

| | Present disclosure | Short-time SPC | Long-time SPC | High-temperature polysilicon | Molten polysilicon | Explosive |
|---|---|---|---|---|---|---|
| Crystal growth mechanism | Solid phase crystallization + sintered bonding | Solid phase crystallization | Solid phase crystallization | Melting | Melting | Partial melting |
| Grain size | 0.2 μm - 2 μm<br>20 nm - 50 nm<br>2-type mixed distribution<br>2 distributions | 10 nm - 30 nm | 1 μm - 5 μm | 350 nm - 500 nm | 0.5 μm - 5 μm | 0.5 μm - 1 μm<br>50 nm - 200 nm<br>2-type mixed distribution<br>2 distributions |
| Crystallinity (Raman crystallization rate) | Intermediate number of amorphous components (70%) | Many amorphous components (40%) | Many amorphous components (No data) | Few amorphous components (No data) | Few amorphous components (At least 95%) | Intermediate number of amorphous components (60%) |
| Grain shape | Irregular, complex | Spherical | Needle-like crystals crossing | Horizontal plane growth polygon | Horizontal plane growth polygon | Partially-horizontal plane growth polygon |
| Crystal | Polycrystalline (with subgrain) | Almost monocrystalline | Almost monocrystalline | Almost monocrystalline | Almost monocrystalline | Almost monocrystalline |
| Orientation | None (irregular) | None (irregular) | Oriented in needle-shape direction | | Oriented (111) | Partially oriented (111) |
| Intragranular defect (EBSP) | There are parts where crystal orientation differs in a curve | Twin<br>Linear form | Twin<br>Linear form | Twin<br>Linear form | Twin<br>Linear form | Twin<br>Linear form |
| Surface | Without protrusions | Without protrusions | Without protrusions | Without protrusions | With grain boundary protrusions (approximately as high as film thickness) | With grain boundary protrusions (approximately as high as film thickness) |
| Flatness of grains not less than 200 nm in grain size | Undulating | Flat | Flat | Flat | Flat | Flat |
| Grain boundaries | Curved | | Straight Corresponding to needle-like crystal | Mainly straight Polygon | Mainly straight Polygon | With straight parts and curved parts |
| Process | Annealing 700 °C - 800 °C 1 - 30 mins. | Annealing 650 °C - several mins. Or LA low energy density | Annealing 600 °C 5 - 20 hrs. | Annealing 900 °C - 1100 °C e.g. at least 30 mins. | LA high energy density | LA intermediate energy density |
| TFT mobility | Up to 10 (30) | 0.5 - 3 | | 20 - 200 | 20 - 200 | 5 - 20 |

($SiH_4$/Ar 70nm 750°C)

(LTPS)

(SiH₄/Ar 70nm 750°C)

FIG. 6
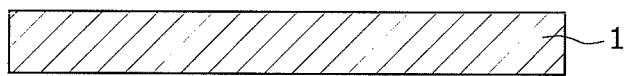
(a)
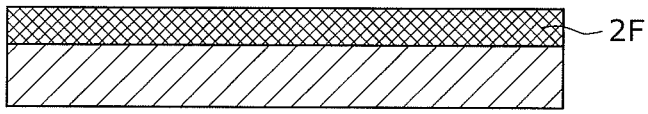
(b)
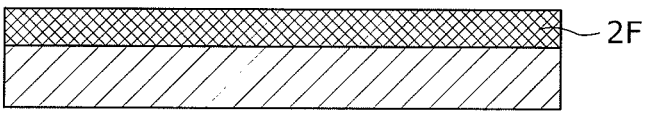
(c)
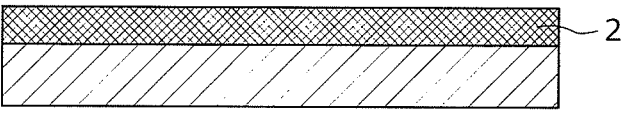
(d)

|  | Condition 1 | Condition 2 | Condition 3 | Ref |
|---|---|---|---|---|
| Growth temperature (°C) | 400 | 400 | 400 | 340 |
| Diluent gas | Hydrogen | None | Argon | Hydrogen |
| Pressure (Torr) | 2 | 2 | 5 | 2 |
| RF power density (W/cm$^2$) | 0.28 | 0.28 | 0.28 | 0.05 |

Condition 1 (SiH4/H2), Crystallization temperature: 750°C, Grain size: 75 nm

Condition 2 (SiH4), Crystallization temperature: 750°C, Grain size: 90 nm

Condition 3 (SiH4/Ar), Crystallization temperature: 750°C, Grain size: 124 nm

Condition 3 (SiH4/Ar), Film thickness: 30 nm, Grain size: 97 nm

Condition 3 (SiH4/Ar), Film thickness: 40 nm, Grain size: 108 nm

Condition 3 (SiH4/Ar), Film thickness: 50 nm, Grain size: 152 nm

Condition 3 (SiH4/Ar), Film thickness: 70 nm, Grain size: 169 nm (SEM image)   (Schematic diagram)

(SEM image)  (Schematic diagram)

(SEM image)  (Schematic diagram)

SEMICONDUCTOR THIN-FILM FORMING METHOD, SEMICONDUCTOR DEVICE, SEMICONDUCTOR DEVICE MANUFACTURING METHOD, SUBSTRATE, AND THIN-FILM SUBSTRATE

CROSS REFERENCE TO RELATED APPLICATIONS

This is a continuation application of PCT Patent Application No. PCT/JP2012/000753 filed on Feb. 3, 2012, designating the United States of America, which is based on and claims priority of Japanese Patent Application No. 2011-063346 filed on Mar. 22, 2011 and Japanese Patent Application No. 2011-186570 filed on Aug. 29, 2011. The entire disclosures of the above-identified applications, including the specifications, drawings and claims are incorporated herein by reference in their entirety.

FIELD

One or more exemplary embodiments disclosed herein relate generally to semiconductor thin-film forming methods, semiconductor devices, semiconductor device manufacturing methods, substrates, and thin-film substrates, and relate particularly to a method of forming a semiconductor thin-film used as a channel layer of a semiconductor device used in a liquid-crystal display device or an organic electroluminescence (EL) display device which are of an active-matrix type, to a semiconductor device including the semiconductor thin-film, to a method of manufacturing the semiconductor device, and so on.

BACKGROUND ART

Active-matrix driven display devices such as liquid-crystal display devices or organic EL display devices use a thin-film semiconductor device (hereafter referred to simply as "semiconductor device") called a thin-film transistor (TFT).

In a display device, a TFT is used as a switching element for selecting a pixel or as a driving transistor which drives a pixel. Such a TFT has a configuration in which a source electrode and a drain electrode, a semiconductor layer (channel layer), and a gate electrode are sequentially stacked on a substrate. A silicon semiconductor in the form of a thin film is typically used for the channel layer used in the TFT (see, Patent Literature (PTL) 1 for example).

Such silicon semiconductor films are broadly divided into non-crystalline silicon films (amorphous silicon: a-SI) and silicon films having crystallinity (crystalline silicon films). Crystalline silicon films are further classified into polycrystalline silicon films, microcrystalline silicon films, monocrystalline silicon films, and so on.

Non-crystalline silicon films can be manufactured evenly on a large-area substrate at relatively low temperatures using a chemical vapor deposition method (CVD method), and are thus presently the most commonly used as channel layers for large-screen liquid-crystal display devices. However, since characteristics, such as carrier mobility (on-characteristics), of non-crystalline silicon films are inferior to those of crystalline silicon films, the realization of TFTs having a crystalline silicon film as a channel layer is eagerly awaited in order to realize a display with enhanced high-speed driving and high-definition.

Conventionally, a method (direct CVD method) of directly forming a crystalline silicon film during film-forming using chemical vapor deposition (CVD) is available as a method of forming a crystalline silicon film (see PTL 2 for example). Alternatively, there is also a method in which a non-crystalline silicon film is formed before hand and then crystallized by applying thermal or light energy (see PTL 3 for example). As a method of applying light energy for crystallization, there is a method (laser annealing method) of locally applying a short burst of energy such as an excimer laser, a solid-state laser, a semiconductor laser, and so on. Furthermore, as methods of applying thermal energy, there are, for example, thermal annealing methods such as rapid thermal annealing (RTA) and rapid thermal processing (RTP), or thermal annealing methods which make use of catalytic action of nickel (Ni), and so on.

CITATION LIST

Patent Literature

[PTL 1] Japanese Unexamined Patent Application Publication No. 6-342909
[PTL 2] Japanese Unexamined Patent Application Publication No. 61-153277
[PTL 3] Japanese Patent No. 3535241

SUMMARY

Technical Problem

However, with conventional methods, forming a crystalline silicon film having high crystallinity, at a low temperature, is difficult.

In view of this, one non-limiting exemplary embodiment was conceived in order to solve such problem of the conventional methods, and provides (i) a semiconductor thin-film forming method capable of forming, at a low temperature, a crystalline silicon film having high crystallinity, (ii) a semiconductor device manufacturing method, (iii) a substrate capable of crystallization at low temperature, (iv) a thin-film substrate containing large-grain-size crystals formed at a low temperature, (v) and a semiconductor device using the thin-film substrate.

Solution to Problem

In one general aspect, the techniques disclosed herein feature a semiconductor thin-film manufacturing method including: forming an amorphous silicon film above a substrate, the amorphous silicon film having a photoluminescence (PL) intensity greater than or equal to 0.65 when photon energy is 1.1 eV in a PL spectrum normalized to have a maximum PL intensity of 1; and annealing the amorphous silicon film to form a crystalline silicon film.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

One or more exemplary embodiments or features disclosed herein enable lowering of the crystallization temperature (increasing the grain size) of an amorphous silicon film. Furthermore, according to one or more exemplary embodiments or features disclosed herein, it is possible to realize a thin-film substrate that includes large-grain-sized crystals formed at a low temperature. With this, a semiconductor device having excellent on-characteristics can be manufactured using a low-temperature process and without the addition of extra processes.

BRIEF DESCRIPTION OF DRAWINGS

These and other advantages and features will become apparent from the following description thereof taken in conjunction with the accompanying Drawings, by way of non-limiting examples of embodiments of the present disclosure.

FIG. 2 is a table compiling characteristics of the crystalline silicon film according to the exemplary embodiment and the conventional crystalline silicon films.

FIG. 6 is a cross-sectional view schematically illustrating a method of forming the crystalline silicon film according to the exemplary embodiment.

DESCRIPTION OF EMBODIMENT

Circumstances Leading to the Present Disclosure

As described above, conventionally, the direct CVD method, the laser annealing method, or the thermal annealing method are available as methods of forming a crystalline silicon film.

However, with the above-mentioned direct CVD method, enlargement of crystal grain size of a non-crystalline silicon film and crystal growth in the direction of carrier movement is difficult (it is reported that, typically, with regard to the crystal growth of silicon films, growth tends to occur in the <110> direction). In addition, in the direct CVD method, an incubation layer including a non-crystalline silicon layer or a low-crystallinity crystalline silicon layer is formed in the interface with the film-forming substrate at the start of film-forming, and thus it is difficult to improve TFT characteristics such as carrier mobility in a bottom-gate TFT in which the channel in which carriers move is located in the interface with the substrate.

Figure 29A:
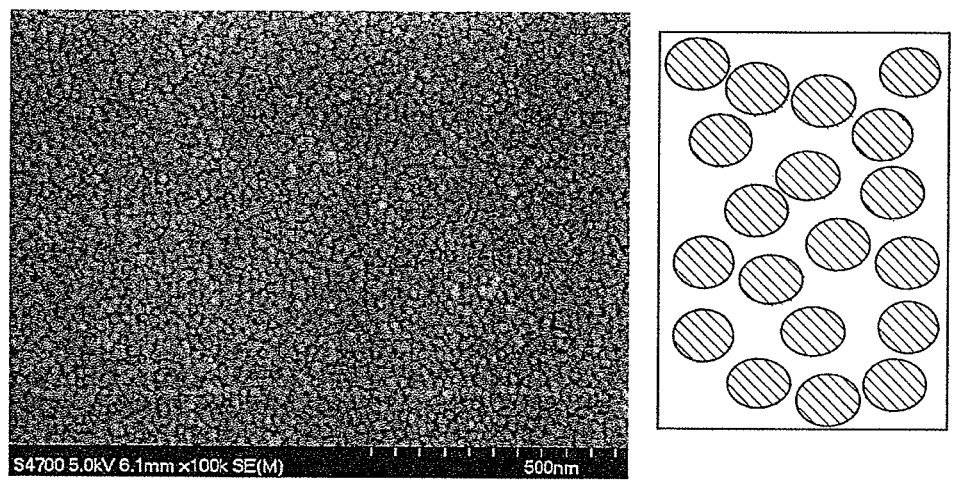
FIG. 29A shows a planar SEM image of a crystalline silicon film having the SPC morphology that is LA-crystallized with low energy density, and a schematic diagram thereof.
Figure 29B:
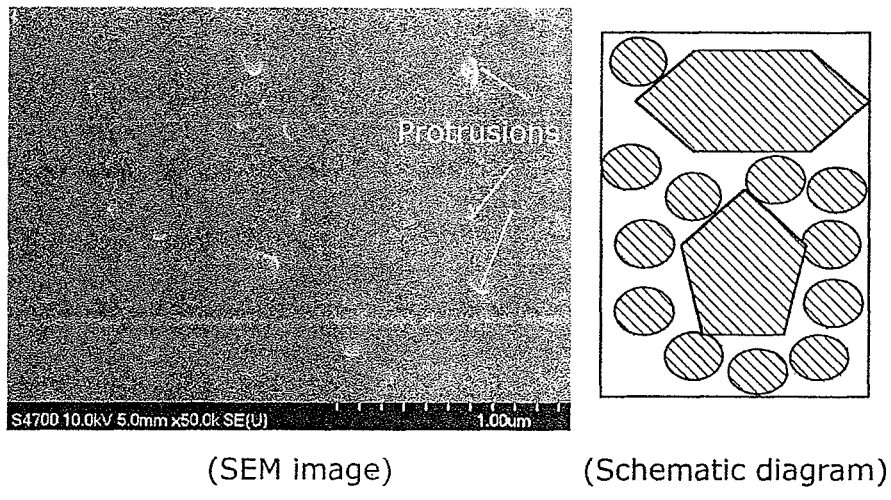
FIG. 29B shows a planar SEM image of a crystalline silicon film having the explosive morphology that is LA-crystallized with intermediate energy density, and a schematic diagram thereof.
Figure 29C:
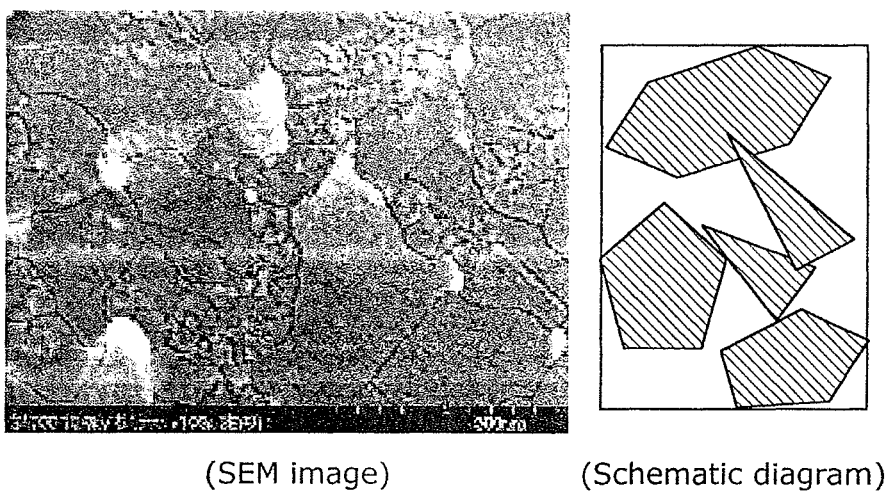
FIG. 29C shows a planar SEM image of a crystalline silicon film having the molten polysilicon morphology that is LA-crystallized with high energy density, and a schematic diagram thereof.

Furthermore, with the laser annealing (LA) method, it is possible to form a crystalline silicon film having an extremely large grain size (>1 µm). As to the crystal morphologies according to the LA method, increasing the density of energy to be irradiated makes it is possible to form a solid phase crystallization (SPC) morphology, an explosive morphology, and a molten silicon morphology. FIG. 29A, FIG. 29B, and FIG. 29C are diagrams showing planar scanning electron microscope (SEM) images of crystalline silicon films crystallized using the conventional LA method. Here, in order to facilitate viewing of crystal grain size, planar SEM observation is performed after Secco etching (etching using a chemical solution prepared using potassium dichromate as an additive to a compound liquid of hydrofluoric acid and water) is carried out. Hereinafter, for the planar SEM images for observing crystal grains, observation is performed by carrying out the same processing. FIG. 29 shows a planar SEM image of a crystalline silicon film having an SPC morphology crystallized by laser annealing with a low energy density, FIG. 29B shows a planar SEM image of a crystalline silicon film having an explosive morphology crystallized by laser annealing with intermediate energy density, and FIG. 29C shows a planar SEM image of a crystalline silicon film having an SPC morphology crystallized by laser annealing with a high energy density.

As shown in FIG. 29A, it can be verified that the SPC morphology formed using the LA method is made of spherical grains with a grain size of approximately 30 nm, and has no noticeable protrusions at the inter-grain boundaries (grain boundaries). Next, as shown in FIG. 29B, it can be verified that the explosive morphology formed using the LA method is a mixed crystal morphology of a molten polysilicon morphology with a grain size of approximately 0.5 to 1 µm and having protrusions at the grain boundaries and a crystal morphology which has a grain size of about 50 nm and has no protrusions at the grain boundaries. Lastly, as shown in FIG. 29C, it can be verified that the molten polysilicon morphology formed using the LA method has a grain size of approximately 0.5 to 5 µm and has protrusions at the grain boundaries. In the crystal morphology melted in the above manner, grain size is increased but there is the problem that protrusions associated with volume expansion due to crystallization are formed in the grain boundaries, and device characteristics and processes are affected.

In addition, there are problems related to manufacturing and device reliability such as the increase in size of manufacturing apparatuses, process stability (specifically, unevenness of crystallization, overlay unevenness, etc.), and so on.

In view of the aforementioned problems, thermal annealing is considered as one effective method that allows easy and stable forming of a crystalline silicon film. The thermal annealing method has a big advantage in the aspects of manufacturing apparatus feasibility and manufacturing process because a homogenous crystalline silicon film can be formed by performing precise substrate temperature control.

In order to improve TFT on-characteristics, improving the crystallinity of the crystalline silicon film, that is, increasing the crystal grain size and reducing crystal defects is typically effective.

In the thermal annealing method, the crystallinity of the crystalline silicon film is dependent on the thermal energy amount, that is, the crystallization temperature and the crystallization time, and thus a higher thermal energy amount enables the formation of a crystalline silicon film having higher crystallinity.

However, from the viewpoint of manufacturing cost and the increase in size of display devices, the use of a glass substrate that is inexpensive and can be increased in size is preferable, and there are limitations to the crystallization temperature and the crystallization time in the crystallization of an amorphous silicon film. For example, the softening point of glass used in a low-temperature polysilicon TFT is typically approximately 600 to 800° C. On the other hand, the crystallization temperature in the thermal annealing method is typically 600° C. or higher.

Therefore, in forming a crystalline silicon film by crystallizing an amorphous silicon film using the thermal annealing method, a crystalline silicon film having high crystallinity must be formed at a low temperature while reducing damage to the glass substrate.

Conventionally, in SPC using the thermal annealing method, in view of glass substrate heat resistance, crystallization is performed at a relatively low temperature (approximately 600° C.) (called long-time SPC). Although the detailed mechanism of SPC shall be described later, in the long-time SPC, the crystal nuclei in the amorphous silicon film which is to become a precursor are eliminated and the amorphous silicon film is crystallized slowly (over a long time), and thereby a crystalline silicon film having a relatively large grain size of approximately 1 to 5 μm can be obtained (see FIG. 2). However, since the time required for crystallization is in the tens of hours and the crystal grain size is dependent on the density of crystal nuclei in the precursor film, cost and process reproducibility pose a problem to industrial usage.

In recent years, glass substrates having high heat resistance have been developed, and there are glass substrates that tolerate a maximum of approximately 800° C. By using such a highly heat-resistant glass substrate and raising the thermal annealing temperature higher than the conventional temperature, studies are underway for thermal anneal crystallization (called short-time SPC) having a processing time and process reproducibility that are industrially usable.

Figure 30A:
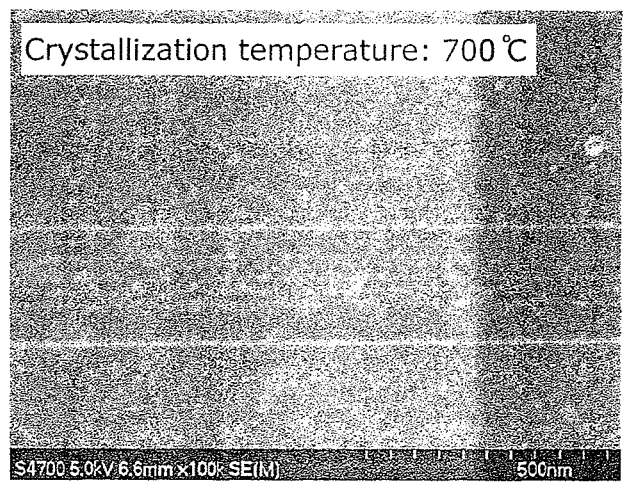
FIG. 30A shows a planar SEM image of a crystalline silicon film that is crystallized from a conventional precursor film at a crystallization temperature of 700° C.
Figure 30B:
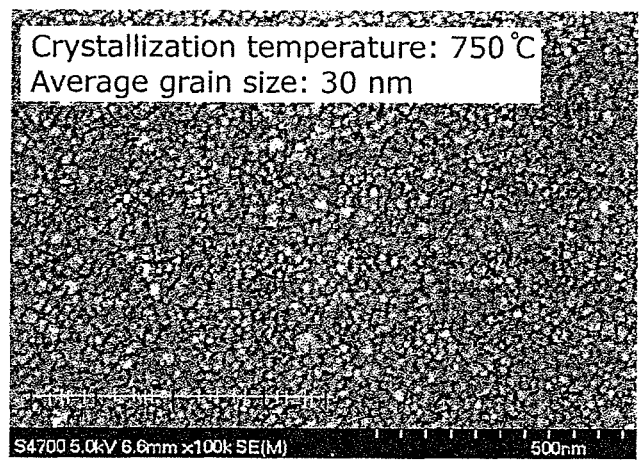
FIG. 30B shows a planar SEM image of a crystalline silicon film that is crystallized from a conventional precursor film at a crystallization temperature of 750° C.

The crystalline silicon film formed using the conventional short-time SPC and the characteristics of a TFT using the film shall be described in greater detail using specific examples. FIG. 30A and FIG. 30B are diagrams showing SEM images of a conventional crystalline silicon film crystallized from an amorphous silicon film (precursor film) using the thermal annealing method. FIG. 30A shows a planar SEM image of a crystalline silicon film that is crystallized by crystallization annealing for 20 minutes at a crystallization temperature of 700° C., and FIG. 30B shows a planar SEM image of a crystalline silicon film that is crystallized by crystallization annealing for 20 minutes at a crystallization temperature of 750° C.

As shown in FIG. 30A, it can be verified that crystallization hardly occurs (etching is performed by Secco etching) when the crystallization temperature is 700° C. On the other hand, as shown in FIG. 30B, crystals having an average grain size of 30 nm grow when the crystallization temperature is 750° C. It should be noted that, although not intended here, crystals having an average grain size of approximately 30 nm were also observed at a crystallization temperature of 800° C. In this manner, when short-time SPC is performed for the conventional amorphous silicon film, only crystals having a grain size of approximately 30 nm can be formed in the temperature range of 800° C. or lower at which glass substrate can be used.

On the other hand, with crystals called high-temperature polysilicon which is processed at a thermal annealing temperature of approximately 900 to 1100° C., the amorphous silicon film and crystalline silicon film (partially) melt, and thus crystalline silicon having an even larger grain size can be obtained. However, since the thermal annealing temperature is high, there is the problem that this method is usually limited to processes using quartz substrates, and the like, and is difficult to adapt to processes for inexpensive glass substrates.

Figure 31:
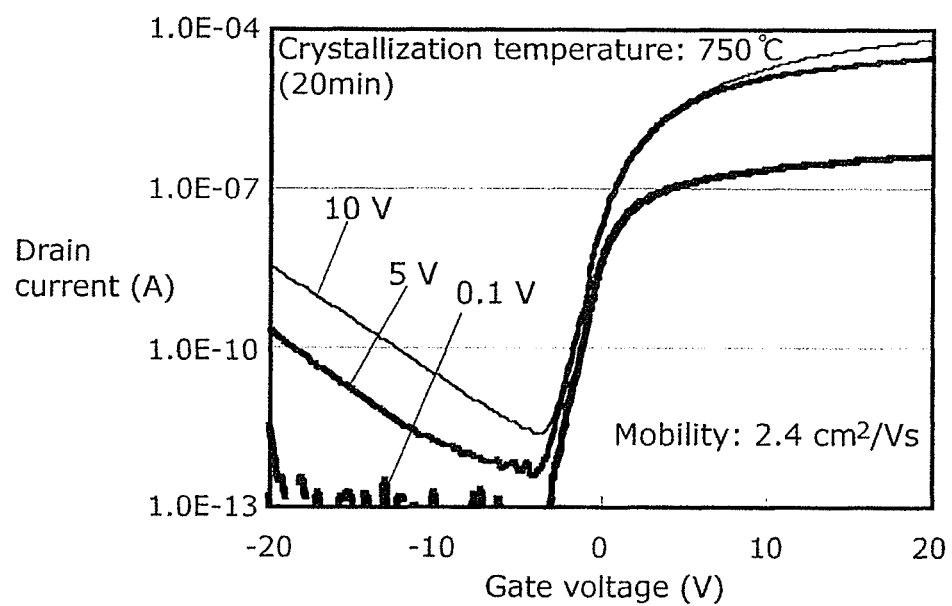
FIG. 31 is a graph showing the transfer characteristics of a thin-film transistor that has, as a channel layer, the crystalline silicon film (in FIG. 30B) that is crystallized from the conventional precursor.

FIG. 31 is a graph showing the transfer characteristics of a TFT that has, as a channel layer, the crystalline silicon film in FIG. 30B. As shown in FIG. 31, the carrier mobility of the TFT in this case is approximately 2.4 cm$^2$/Vs. Furthermore, according to the studies of the inventors, the same TFT carrier mobility measurement was also performed for crystalline silicon film crystallized at an annealing temperature of approximately 700 to 800° C. but it was verified that there was virtually no change from the above carrier mobility. In addition, although not shown in the figure, with regard to the uniformity of TFT characteristics, a level of uniformity that is sufficiently applicable to a driving element can be realized by controlling the uniformity of intra-surface temperature at the time of crystallization annealing. It should be noted that in the forgoing and subsequent description of the thermal annealing method, an annealing method using the catalytic action of Ni and the like.

In this manner, in the case of forming a crystalline silicon film by crystallizing an amorphous silicon film using the thermal annealing method, realizing a TFT having sufficient on-characteristics for driving an organic EL element or a high-definition liquid-crystal element is difficult with a crystalline silicon film that is formed using crystallization annealing at a temperature range that can be used for a glass substrate.

One non-limiting exemplary embodiment was conceived based on the foregoing knowledge, and provides (i) a semiconductor thin-film forming method capable of forming, at a low temperature, a crystalline silicon film having high crystallinity, (ii) a semiconductor device manufacturing method, (iii) a substrate capable of crystallization at low temperature, (iv) a thin-film substrate containing large-grain-size crystals formed at a low temperature, (v) and a semiconductor device using the thin-film substrate.

A semiconductor thin-film manufacturing method according to an aspect in the present disclosure includes: forming an amorphous silicon film above a substrate, the amorphous silicon film having a photoluminescence (PL) intensity greater than or equal to 0.65 when photon energy is 1.1 eV in a PL spectrum normalized to have a maximum PL intensity of 1; and annealing the amorphous silicon film to form a crystalline silicon film.

According to this aspect, since it is possible to create a region (pseudo-crystal nucleus) in which the density of bonds between Si atom and Si atom is high locally in the amorphous silicon film which is the precursor film of the crystalline silicon film, the activation energy of crystallization in the crystallization annealing can be reduced, and it is possible to lower the temperature (increase the grain size compared to the grain size at the same crystallization temperature in the conventional method). Therefore, the grain size of the crystalline silicon film formed according to the exemplary embodiment can be made bigger than the grain size of the crystalline silicon film that has undergone the same crystallization annealing as in the conventional method. Therefore, by manufacturing a TFT having, as a channel layer, the crystalline silicon film formed according to this aspect, it is possible to improve on-state current.

Here, "a region in which the density of bonds between Si atom and Si atom is high" refers not to a region in which the crystal grain size is for example 5 nm or several tens of nm or higher, as in polycrystalline silicon or microcrystalline silicon, but to a region in which the density of bonds between Si atom and Si atom that are bonded in a diamond bond structure is high, and in which the density of bonds between Si atom and Si atom having an amorphous structure is less than the bond density for the bonding in the diamond-bond structure.

In addition, for example, in a semiconductor thin-film manufacturing method according to an aspect in the present disclosure, in the forming, the PL intensity when the photon energy is 1.1 eV in the normalized PL spectrum is less than or equal to 0.8.

When there are too many regions in which the density of bonds between Si atom and Si atom is locally high within the non-crystalline silicon film, this conversely becomes an obstacle to the growth of crystal grain size. In view of this, in this aspect, the PL intensity of the amorphous silicon film when the photon energy is 1.1 eV is kept to 0.8 or lower. Accordingly, the crystallization activation energy reducing effect of the region having a high density of bonds between Si atom and Si atom can be reliably manifested.

In addition, for example, in a semiconductor thin-film manufacturing method according to an aspect in the present disclosure, in the forming, the amorphous silicon film includes Si—Si bond regions as pseudo-crystal nuclei, and in the annealing, the annealing crystallizes the amorphous silicon film with the pseudo-crystal nuclei as nuclei, to form the crystalline silicon film. Furthermore, for example, in a semiconductor thin-film manufacturing method according to an aspect in the present disclosure, an average grain size of the pseudo-crystal nuclei is smaller than or equal to an average critical crystal nucleus size.

According to these aspects, the effect of reducing the activation energy in crystallization produced by the pseudo-crystal nuclei in the non-crystalline silicon film can be reliably manifested.

Furthermore, for example, in a semiconductor thin-film manufacturing method according to an aspect in the present disclosure, the average grain size of the pseudo-crystal nuclei is less than or equal to 1 nm.

According to this aspect, the average grain size is a size which functions as a pseudo-crystal nucleus, thus the effect of reducing the activation energy in crystallization produced by the pseudo-crystal nuclei can be reliably manifested.

Furthermore, for example, in a semiconductor thin-film manufacturing method according to an aspect in the present disclosure, the substrate is a glass substrate. Furthermore, for example, in a semiconductor thin-film manufacturing method according to an aspect in the present disclosure, the annealing is performed at a temperature lower than or equal to a melting point of glass.

According to these aspects, since it is possible to form a crystalline silicon film above the glass substrate, a TFT can be formed on a large-sized substrate, using a simple process.

In addition, for example, in a semiconductor thin-film manufacturing method according to an aspect in the present disclosure, an average grain size of crystals in the crystalline silicon film is in a range from 30 nm to 300 nm.

According to this aspect, it is possible to reduce TFT unevenness caused by effects of protrusions formed in the grain boundaries.

In addition, for example, in a semiconductor thin-film manufacturing method according to an aspect in the present disclosure, in the forming, the amorphous silicon film is formed by plasma processing under a forming condition that plasma density is in a range from 0.1 W/cm$^2$ to 0.5 W/cm$^2$. Furthermore, for example, in a semiconductor thin-film manufacturing method according to an aspect in the present disclosure, in the forming, a crystal growth temperature of the amorphous silicon film is in a range from 350° C. to 500° C.

According to these aspects, regions (pseudo-crystal nuclei) in which the density of bonds between Si atom and Si atom is locally high can be formed more reliably within the non-crystalline silicon film.

In addition, for example, in a semiconductor thin-film manufacturing method according to an aspect in the present disclosure, in the forming, the amorphous silicon film is formed using a source gas and an inert gas. Furthermore, for example, in a semiconductor thin-film manufacturing method according to an aspect in the present disclosure, in the forming, the source gas includes any one of silane gas, disilane gas, and trisilane gas. Furthermore, for example, in a semiconductor thin-film manufacturing method according to an aspect in the present disclosure, in the forming, the inert gas includes argon gas.

According to these aspects, plasma of plasma CVD can be formed stably, and thus regions (pseudo-crystal nuclei) in which the density of bonds between Si atom and Si atom is locally high can be formed more reliably within the non-crystalline silicon film.

Furthermore, a semiconductor device according to an aspect in the present disclosure includes: a substrate; a gate electrode; a gate insulating film; a crystalline silicon film; a source electrode; and a drain electrode, wherein the crystalline silicon film is formed by: forming an amorphous silicon film above the substrate, the amorphous silicon film having a photoluminescence (PL) intensity greater than or equal to 0.65 when photon energy is 1.1 eV in a PL spectrum normalized to have a maximum PL intensity of 1; and annealing the amorphous silicon film.

According to this aspect, since it is possible to create a region (pseudo-crystal nucleus) in which the density of bonds between Si atom and Si atom is high locally in the amorphous silicon film which is the precursor film of the crystalline silicon film, the activation energy of crystallization in the crystallization annealing can be reduced, and it is possible to lower the temperature (increase the grain size compared to the grain size at the same crystallization temperature in the conventional method). Therefore, the grain size of the crystalline silicon film formed according to this aspect can be made bigger than the grain size of the crystalline silicon film that has undergone the same crystallization annealing as in the conventional method. Therefore, by manufacturing a TFT having, as a channel layer, the crystalline silicon film formed according to this aspect, it is possible to improve on-state current.

In addition, for example, in a semiconductor device according to an aspect in the present disclosure, the gate electrode is above the substrate, the gate insulating film is above the gate electrode, the crystalline silicon film is above the gate insulating film, the source electrode is above the crystalline silicon film, and the drain electrode is above the crystalline silicon film.

According to this aspect, it is possible to obtain, with a top-gate TFT, a TFT having not only excellent on-characteristics but also reduced unevenness of characteristics.

In addition, for example, in a semiconductor device according to an aspect in the present disclosure, the crystalline silicon film is above the substrate, the source electrode is above one end region of the crystalline silicon film, the drain electrode is above an other end region of the crystalline silicon film, the gate insulating film is above the source electrode, the drain electrode, and the crystalline silicon film between the source electrode and the drain electrode, and the gate electrode is above the gate insulating film.

According to this aspect, it is possible to obtain, with a bottom-gate TFT, a TFT having not only excellent on-characteristics but also reduced unevenness of characteristics.

One or more exemplary embodiments in the present disclosure can be applied to a substrate above which an amorphous silicon film is formed. According to this aspect, regions (pseudo-crystal nuclei) in which the density of bonds between Si atom and Si atom is locally high are present in the amorphous silicon film. Accordingly, crystallization is possible at a low crystallization temperature in the case of a crystalline silicon film having the same grain size as the conventional crystal grain size, and a crystalline silicon film having a larger grain size than the grain size of a conventional crystalline silicon film can be formed when a crystalline silicon film is formed using the same crystallization temperature as the conventional crystallization temperature. Therefore, by manufacturing a TFT by forming a crystalline silicon film using the same crystallization annealing in the conventional method, it is possible to obtain a TFT having superior on-characteristics than a TFT using the conventional crystalline silicon film.

Furthermore, a thin-film substrate according to an aspect in the present disclosure includes: a substrate; and a thin-film formed above the substrate and including crystallized regions obtained by crystallizing predetermined regions, wherein each of the crystallized regions has first crystals and second crystals, an average grain size of the first crystals is larger than an average grain size of the second crystals, and the first crystals are formed through sintering of the second crystals.

In addition, for example, in a thin-film substrate according to an aspect in the present disclosure, in the crystallized regions, protrusions are not formed in a grain boundary. By adopting a form that has no protrusions in the grain boundaries, it is possible to avoid problems involved when a device is manufactured such as the disconnection of the electrode film, passivation film, etc. due to a step in an underlying layer, or the occurrence of pinholes, etc. when, for example, films such as an electrode film, passivation film, etc. are formed on the crystallized region.

In addition, for example, in a thin-film substrate according to an aspect in the present disclosure, the first crystals include crystal grains having an average crystal grain size in a range from 200 nm to 2 µm, and the second crystals include crystal grains having an average crystal grain size in a range from 20 nm to 50 nm. Setting the average crystal grain size of the first crystals to 200 nm or larger allows for improvement of mobility, and setting the average crystal grain size of the first crystals to 2 µm or less facilitates crystal film forming. Furthermore, setting the average crystal grain size of the second crystals in a range from 20 nm to 50 nm facilitates growth of large crystal grains such as the first crystal grains even with low-temperature solid phase crystallization. This is because, since the surface energy of the grains is high when grain size is small, the surface energy of the grains allows the energy (temperature) required for crystallization to be kept low.

In addition, for example, in a thin-film substrate according to an aspect in the present disclosure, the second crystals are grown by solid phase crystallization. With solid phase crystallization, it is possible to lower the temperature of the substrate compared to molten crystallization.

In addition, for example, in a thin-film substrate according to an aspect in the present disclosure, the second crystals are single-grained. When the second crystals are single-grained, that is, have a monocrystal structure, the crystal orientation of the first crystals becomes easy to control due to the influence of such single-grained crystal orientation. When the second crystals are already polycrystals, the crystal orientation of the first crystals becomes difficult to control due to the influence of plural crystal orientations.

In addition, for example, in a thin-film substrate according to an aspect in the present disclosure, at least one of the second crystals has a grain boundary formed by a single crystal plane. Since the grain boundary of the second crystals is formed by a single crystal plane, the crystal orientation of the first crystals becomes even easier to control.

In addition, for example, in a thin-film substrate according to an aspect in the present disclosure, at least one of the second crystals has a grain boundary formed by plural crystal planes.

In addition, for example, in a thin-film substrate according to an aspect in the present disclosure, at least one of the first crystals includes crystals formed with mutually different crystal orientations.

In addition, for example, in a thin-film substrate according to an aspect in the present disclosure, the first crystals have an intra-granular roughness originating from the second crystals.

In addition, for example, in a thin-film substrate according to an aspect in the present disclosure, each of the crystallized regions has a Raman spectroscopic analysis crystallization rate in a range from 65 percent to 85 percent.

Hereinafter, certain exemplary embodiments are described in greater detail with reference to the accompanying Drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

Embodiment

Hereinafter, an exemplary embodiment shall be described in detail with reference to the Drawings. It should be noted that the exemplary embodiment described below shows one specific example. Therefore, the numerical values, shapes, materials, structural elements, the arrangement and connection of the structural elements, steps, the processing order of the steps, etc. shown in the following exemplary embodiment are mere examples, and therefore do not limit the scope of the appended claims and their equivalents. Thus, among the structural elements in the following exemplary embodiment, structural elements not recited in any one of the independent claims are described as arbitrary structural elements. Furthermore, in the subsequent Drawings, constituent elements having substantively the same functions are given the same reference sign in order to simplify description. Moreover, the respective figures are schematic and are not necessarily exact illustrations.

(Sintered Crystal Morphology)

Figure 1A:
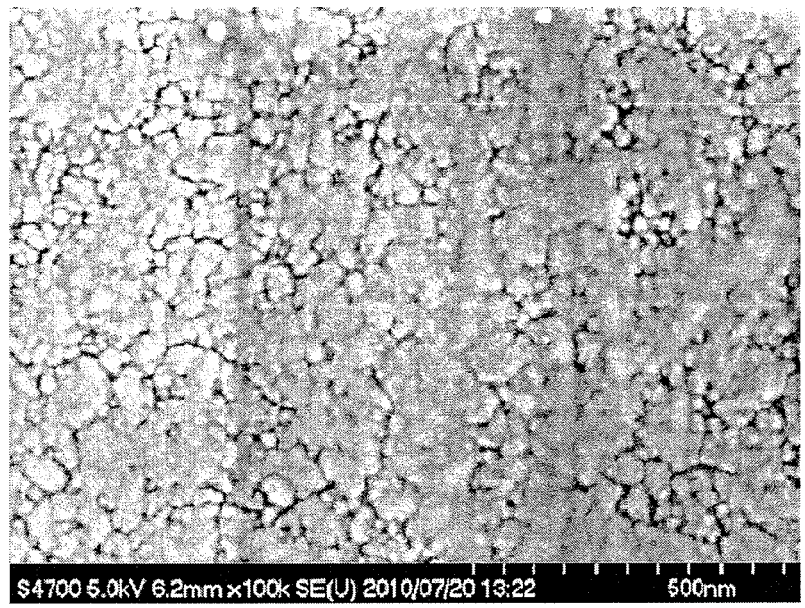
FIG. 1A is a diagram showing a planar SEM image of a crystalline silicon film according to an exemplary embodiment.
Figure 1B:
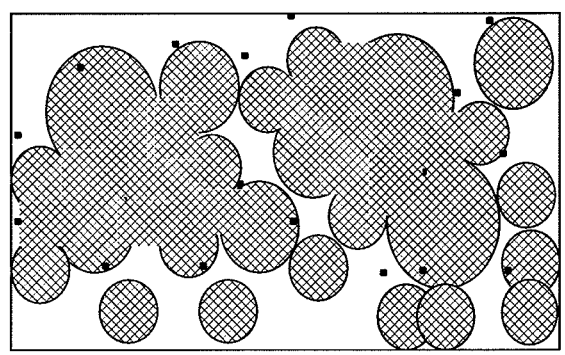
FIG. 1B is a schematic diagram of the crystalline silicon film according to the exemplary embodiment.

Hereinafter, the structure of a crystalline silicon film formed above a thin-film substrate according to the exemplary embodiment shall be described with reference to the Drawings, while comparing characteristics with the conventional crystal morphology. FIG. 1A is a diagram showing a planar scanning electron microscope (SEM) image of the crystalline silicon film according to the exemplary embodiment, and FIG. 1B is a schematic diagram showing the crystalline silicon film according to the exemplary embodiment. Furthermore, FIG. 2 is a table compiling the characteristics of the crystalline silicon film according to the exemplary embodiment and conventional crystalline silicon films.

First, the crystalline silicon film shown in FIG. 1A is obtained by performing thermal processing for 20 minutes at a crystallization temperature of 750° C. using the thermal annealing method. The crystalline silicon film shown in FIG. 1A is a thin-film including a crystallized region obtained by crystallizing a predetermined region, and has a new crystal morphology having a crystal morphology structure different from the conventionally reported crystal morphology such as those compiled in FIG. 2. This new crystal morphology is a structure having sintered grains for which it is thought that the crystal grains formed by SPC have lost the grain boundaries between grains due to the sintering phenomenon. Hereinafter, this structure shall be referred to in the present disclosure as a "sintered morphology".

Next, the characteristics of the sintered morphology in the crystalline silicon film according to the present disclosure shall be described with reference to FIG. 2 and FIG. 29A to FIG. 29C. FIG. 29A shows a planar SEM image of a crystalline silicon film having the SPC morphology that was LA-crystallized with low energy density, and a schematic diagram thereof. FIG. 29B shows a planar SEM image of a crystalline silicon film having the explosive morphology that was LA-crystallized with intermediate energy density, and a schematic diagram thereof. FIG. 29C shows a planar SEM image of a crystalline silicon film having the molten polysilicon morphology that was LA-crystallized with high energy density, and a schematic diagram thereof.

First, the crystal morphology (except explosive) in the conventional crystalline silicon film has a single grain size distribution whereas the sintered morphology in the crystalline silicon film according to the present disclosure (hereafter simply referred to as the "crystal morphology in the present disclosure") has the characteristic of having the two grain size distributions of crystal grains having an average crystal grain size of 200 nm to 2 μm and crystal grains having an average crystal grain size of 20 nm to 50 nm. The crystallized region of the crystalline silicon film in the present disclosure has first crystals having a relatively large average crystal grain size and second crystals having a relatively small average crystal grain size. In other words, the average crystal grain size of the crystal grains of the first crystals is larger than the average crystal grain size of the crystal grains of the second crystals. In addition, as described later, each of the first crystals having a large crystal grain size is formed by the sintering of the second crystals.

Figure 3A:
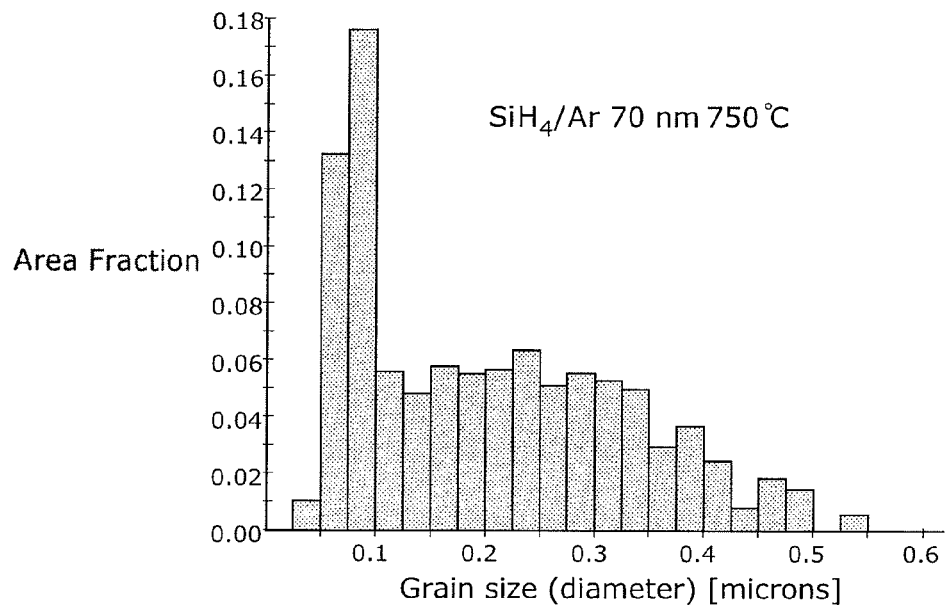
FIG. 3A is a graph showing a grain size distribution calculated from the electron backscattering pattern of the sintered morphology of the crystalline silicon film according to the exemplary embodiment.
Figure 3B:
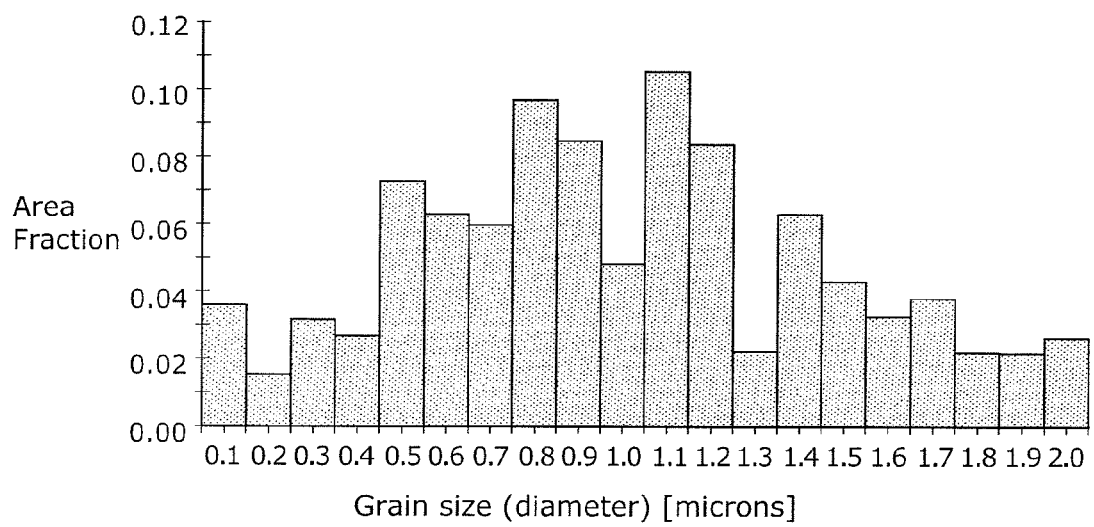
FIG. 3B is a graph showing a grain size distribution calculated from the electron backscattering pattern of the morphology of a conventional crystalline silicon film.

Here, grain size distributions calculated from the electron backscattering patterns (EBSPs) of the sintered morphology of the crystalline silicon film according to the exemplary embodiment and the conventional molten polysilicon morphology are shown using FIG. 3A and FIG. 3B. It can be confirmed that, although the absolute values per se are slightly different from those of the grain size obtained using planar SEM, the grain size of the crystal morphologies calculated using EBSP matches the trend of the grain size distribution described above. Therefore, like the explosive crystal morphology using the LA method, the sintered morphology in the present disclosure is a mixed crystal morphology of two types of crystal morphologies having different generation mechanisms.

Next, the difference from the explosive morphology shall be described. As described above, because the explosive morphology includes the molten polysilicon morphology, the explosive morphology is characterized in that protrusions are formed at the grain boundaries. As described in FIG. 29B, in the SEM image, the brightly contrasted parts of the grain boundary of grains that are thought to be of the molten polysilicon morphology having a relatively large grain size correspond to the protrusions. On the other hand, as shown in FIG. 1A, in the sintered morphology in the present disclosure, protrusions such as those described above cannot be observed even in the grain boundaries of grains having a relatively large grain size. Therefore, it is thought that the enlargement of grain size in the sintered morphology in the present disclosure is caused not by the molten polysilicon morphology but by a different generation mechanism (sintering). The detailed mechanism shall be described later.

Figure 4A:
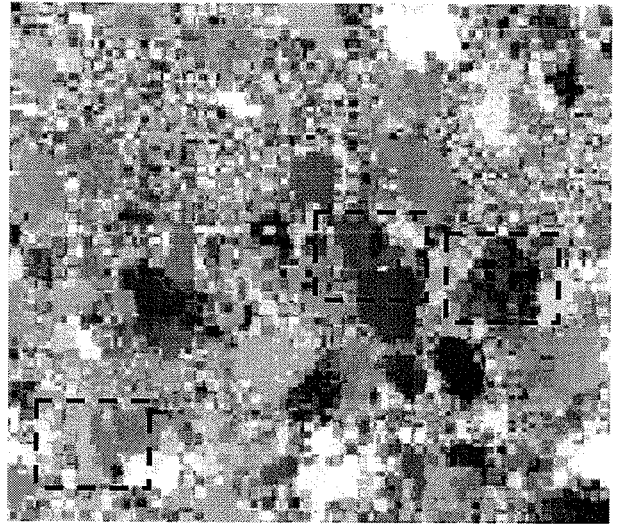
FIG. 4A is a diagram showing a crystal orientation map obtained from the electron backscattering pattern of the sintered morphology of the crystalline silicon film according to the exemplary embodiment.
Figure 4B:
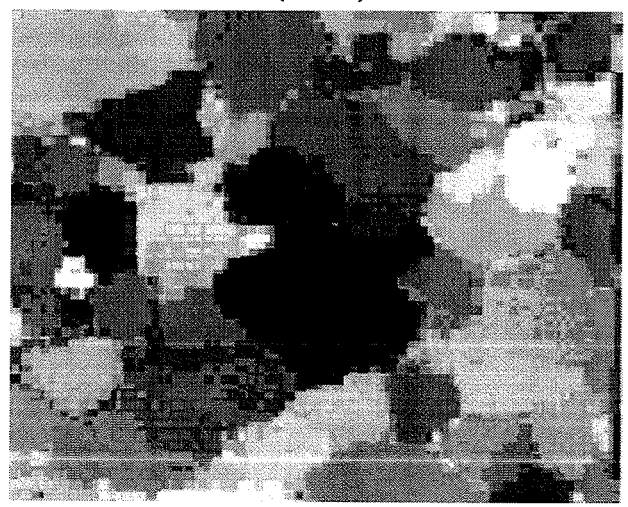
FIG. 4B is a diagram showing a crystal orientation map obtained from the electron backscattering pattern of the conventional molten polysilicon morphology.

Next, the characteristics related to the crystal structure inside a grain and the crystal orientation of the grain shall be described using the result of EBSP. FIG. 4A and FIG. 4B are crystal orientation maps obtained from the EBSP of the sintered morphology of the crystalline silicon film according to the exemplary embodiment and the molten polysilicon morphology, respectively. As shown in FIG. 4B, although structures corresponding to crystal defects such as Twin can be observed in the molten polysilicon morphology, the crystal orientation in one grain is singular, in other words, monocrystal (single-grained). In contrast, as shown in FIG. 4A, in the grain of the sintered morphology in the present disclosure, there is a region (the region surrounded by the broken lines in the figure) that is surrounded by a different crystal (a crystal having a different crystal orientation) inside a grain having a large grain size. This result also suggests that the grains of the sintered morphology in the present disclosure are not generated by molten crystallization. Such a sintered morphology is expected to show material properties such as being pseudo-single-grained despite allowing forming at low temperature. Furthermore, as shown in FIG. 4A, since crystals other than those of the sintered morphology are of the SPC morphology, they are formed mainly single-grained (grain boundary is a plane having a single crystal orientation). In this manner, sintering progresses easily in a single-grained crystal or where the grain boundary is a plane having a single crystal orientation, and, through the formation of a fused crystal by sintering, it is possible to form a crystallized region in which the first crystals, which include crystals formed with different crystal orientations, are present.

Figure 5:
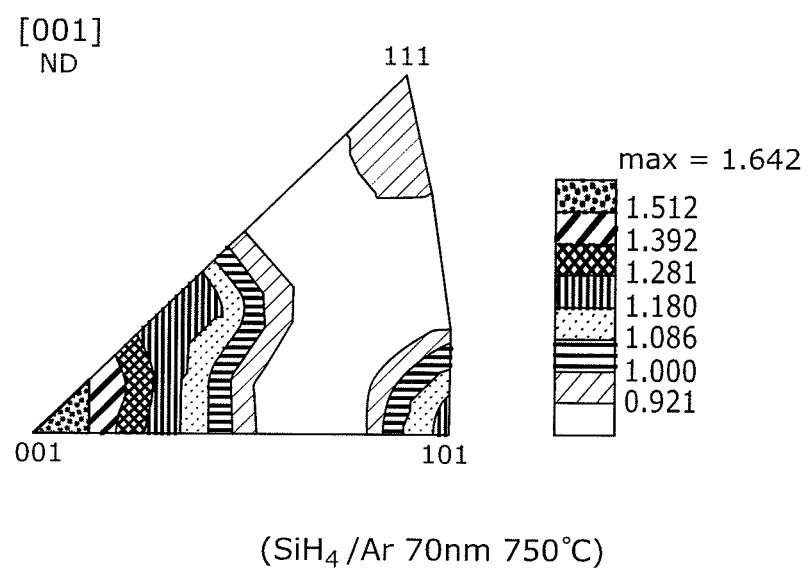
FIG. 5 shows an inverse pole figure for the sintered morphology of the crystalline silicon film according to the exemplary embodiment.

Furthermore, FIG. 5 shows an inverse pole figure for the sintered morphology of the crystalline silicon film according to the exemplary embodiment. The molten polysilicon morphology crystallized using the conventional excimer LA method is known to be directed to the <111> direction but the sintered morphology in the present disclosure is characterized in having virtually no orientation as shown in FIG. 2.

As described above, the crystalline silicon film according to the exemplary embodiment has a sintered morphology having sintered grains that have lost the grain boundaries between the grains due to the sintering phenomenon. Furthermore, according to the crystalline silicon film according to the exemplary embodiment, the protrusions formed in the grain boundaries, which are considered to be a problem, are not formed in the molten crystal, and thus it is possible to improve the reliability of the device and processes that use the crystalline silicon film according to the exemplary embodiment.

(Method of Forming and Growth Mechanism of Crystalline Silicon Film)

The method of forming the crystalline silicon film according to the exemplary embodiment and the growth mechanism and the function effect of the crystalline silicon film shall be described with reference to the Drawings. FIG. 6 is a cross-sectional view schematically illustrating the method of forming the crystalline silicon film according to the exemplary embodiment.

First, as shown in (a) in FIG. 6, a glass substrate is prepared as a substrate 1. It should be noted that, when the subsequent crystallization processing is performed directly on the substrate 1, it is advisable to remove impurities such as organic substances found on the surface of the substrate 1 using a predetermined chemical solution because the state of the interface between the substrate 1 and a precursor film 2F affects crystal growth. Furthermore, an undercoat layer (not shown in the figure) made of a silicon oxide film ($SiO_X$), a silicon nitride film ($SiN_X$), or a silicon oxynitride ($SiON$), and the like, may be formed on the substrate 1.

Next, as shown in (b) in FIG. 6, the precursor film 2F made of an amorphous silicon film is formed above the substrate 1 as a non-crystalline silicon film. The precursor film 2F is a precursor film which, by being crystallized, becomes a crystalline silicon film. In the exemplary embodiment, the precursor film 2F is a film in which a region (pseudo-crystal nucleus) having a large amount of bonds between Si atom and Si atom is included locally in the amorphous silicon film.

Such a precursor film 2F can be formed by plasma CVD and the like. As film-forming conditions of the precursor film 2F, for example, the film-forming temperature is set to 250 to 500° C. and the growth pressure is set to 0.1 to 10 Torr, silane ($SiH_4$) is used as the source gas, and an inert gas such as hydrogen, argon, or helium is used as a diluent gas. The thickness of the precursor film 2F is, for example, approximately 20 to 100 nm. It should be noted that aside from silane gas, disilane gas or trisilane gas can also be used as a source gas.

Next, crystallization annealing is performed on the precursor film 2F. Specifically, as shown in (c) in FIG. 6, the precursor film 2F is annealed at a temperature ranging from 500° C. to 1000° C. With this, as shown in (d) in FIG. 6, the precursor film 2F crystallizes and a crystalline silicon film 2 can be formed.

In the exemplary embodiment, crystallization of the precursor film 2F is performed by performing annealing for approximately 1 minute to 2 hours using rapid thermal processing (RTP). Furthermore, when a glass substrate is used as the substrate 1, it is preferable that annealing be performed at a temperature of 800° C. or lower in order to suppress damage to or distortion of the glass substrate. It should be noted that it is sufficient to adjust the annealing temperature, the annealing time, and the thickness of the precursor film 2F in order to obtain the desired grain size in the crystalline silicon film 2. This allows grain size to be controlled. In addition, in order to prevent film damage due to bumping of hydrogen inside the non-crystalline silicon film when using an annealing method (for example, laser annealing, flash lamp annealing, etc.) which rapidly raises the temperature (>100° C./sec.), crystallization annealing may be performed after performing dehydrogenation annealing at a temperature of 400° C. or higher which is the temperature at which hydrogen escapes from the non-crystalline silicon film.

As described above, according to the crystalline silicon film forming method according to the exemplary embodiment, a crystalline silicon film is formed by crystallizing a precursor film which is an amorphous silicon film including pseudo-crystal nuclei, and thus it is possible to reduce the activation energy of the crystallization in the crystallization annealing. As such, crystals having small grain size grow with high density, and sintering of the crystal grains occurs so that surface energy in the crystalline silicon film is minimized. With this, it is possible to lower the crystallization temperature of the amorphous silicon film (increase the grain size compared to the grain size for the same crystallization temperature of the conventional method).

Figure 7:
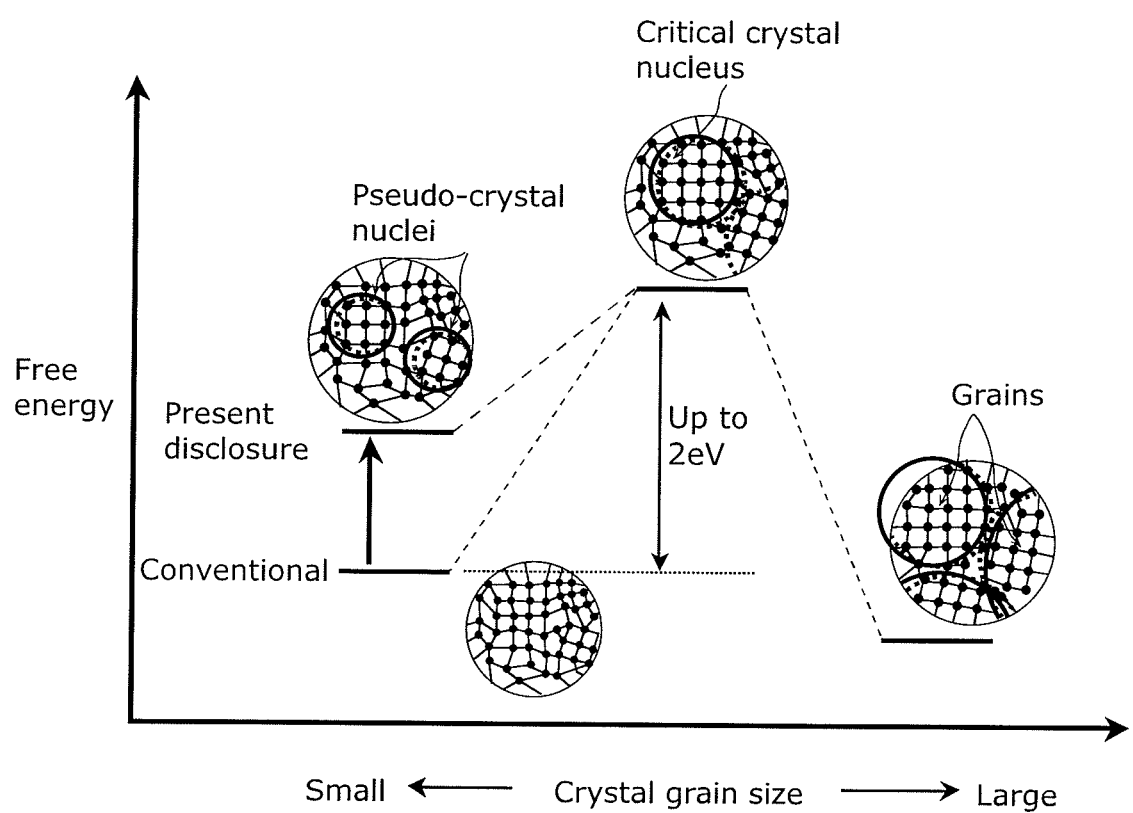
FIG. 7 is a diagram schematically showing the relationship between free energy and the silicon film crystal grain size, in an amorphous silicon film in the present disclosure.
Figure 8:
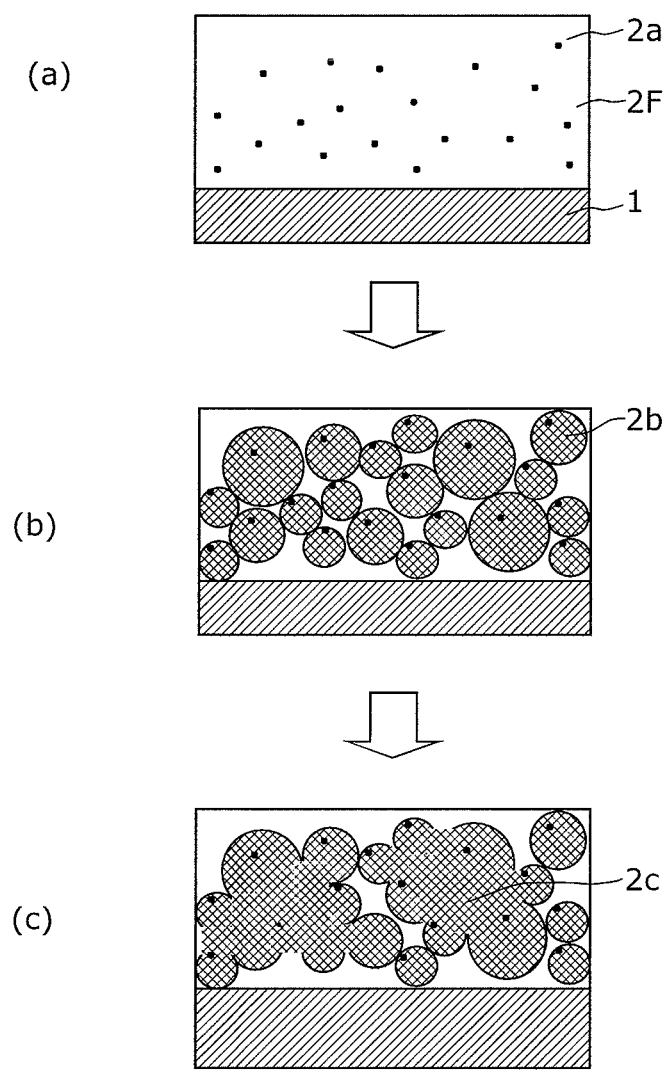
FIG. 8 is a cross-sectional view schematically illustrating the forming mechanism of the sintered morphology of the crystalline silicon film according to the exemplary embodiment.

Hereinafter, the mechanism by which the activation energy in crystallization is reduced and the crystallization temperature is lowered shall be described with reference to FIG. 7 and FIG. 8. FIG. 7 is a diagram for describing the crystallization mechanism of the amorphous silicon film in the present disclosure, and is a diagram schematically showing the relationship between free energy and the silicon film crystal grain size. In FIG. 7, the vertical axis denotes free energy, and the horizontal axis denotes crystal grain size. FIG. 8 is a cross-sectional view schematically illustrating the forming mechanism of the sintered morphology in the present disclosure.

First, as shown in FIG. 7, generally, in the solid phase crystallization (SPC) of a crystalline silicon film, it is possible to have a process where crystal nuclei are formed inside the non-crystalline silicon (amorphous silicon) film following the increase in free energy, and crystals grow from the crystal nuclei.

The free energy for generating a crystal nucleus tends to increase since the surface energy becomes dominant as the crystal nucleus size is smaller. When the crystal nucleus size exceeds the critical crystal nucleus size (approximately 1 to 2 nm), free energy decreases which promotes crystal growth.

In this case, in order to have crystal growth of the conventional crystalline silicon film using the solid phase crystallization, it is necessary to overcome the approximately 2 eV energy barrier required for crystal nucleus generation, and this barrier becomes the rate determining process in the crystal growth.

In contrast, in the non-crystalline silicon film (precursor film) in the present disclosure, by generating before hand, in the film, small crystal nuclei (pseudo-crystal nuclei) having an average grain size that is less than or equal to the average grain size of the critical crystal nucleus, the free energy of the precursor film can be increased immediately after the film-forming as shown in FIG. 7. In other words, it becomes possible to lower the barrier of the activation energy required in the crystal nuclei forming. It should be noted that, as described above, the pseudo-crystal nucleus is a region in which the amount of bonds between Si atom and Si atom is locally high in the silicon film, and the average grain size of the pseudo-crystal nucleus is 1 nm or lower.

In this manner, in the exemplary embodiment, pseudo-crystal nuclei having increased free energy exist in the amorphous silicon film (precursor film) immediately after film-forming (before crystallization annealing), and thus it is possible to reduce the activation energy of crystallization in the subsequent crystallization annealing.

Next, the mechanism by which the sintered morphology is generated in the crystal growth in the present disclosure shall be described with reference to FIG. 8. FIG. 8 is a cross-sectional view schematically illustrating the forming mechanism of the sintered morphology of the crystalline silicon film according to the exemplary embodiment.

As shown in (a) in FIG. 8, starting point 2a which undergoes crystal growth using thermal annealing is included in the precursor film 2F (non-crystalline silicon film) in the exemplary embodiment. The primary component of the starting point 2a is the above-described pseudo-crystal nuclei but there are also instances where other film defects, and so on, also become starting points. Furthermore, in the precursor film 2F, a starting point (pseudo-crystal nucleus) from which crystal is generated is generated with high density compared to the conventional long-time SPC growth.

Next, as shown in (b) in FIG. 8, a short-time SPC morphology grows by performing thermal annealing on the precursor film 2F. In the precursor film 2F in the exemplary embodiment, it is possible that a crystal (second crystal) having a smaller grain size than the normal short-time SPC will be generated with high density because the pseudo-crystal nuclei is generated with high density.

Next, as shown in (c) FIG. 8, during the process in which the short-time SPC morphology is generated, a sintered crystal 2c (first crystal) having a relatively large grain size is generated through the sintering of the aforementioned crystals having a small grain size.

Here, the phenomenon of "sintering" which is a characteristic feature of the sintered morphology in the present disclosure shall be described. Sintering is a phenomenon of mass transfer to the direction in which surface energy of the entire grain system is reduced, when grains that are in a contact state are held at a temperature lower than or equal to the melting point thereof. In sintering, mass transfer of atoms occurs by performing volume diffusion, surface diffusion, evaporation/condensation in a temperature at which occurrence of atom diffusion is sufficiently possible. The major factors in the sintering process are the diffusion coefficient of atoms, surface energy, and grain size. The temperature at which sintering occurs is different depending on the situation of the major factors, and there are cases where sintering occurs at about half the temperature of melting point. Specifically, using sintering allows crystal grain size to be increased at a temperature that is significantly lower than the melting point (silicon melting point: 1410° C.; amorphous silicon melting point: approximately 1000° C.).

In the crystallization using the precursor film in the exemplary embodiment, grains having a small grain size are formed with high density, and thus the surface energy of the grain system becomes large. It is possible that through the sintering of grains in order to reduce this surface energy, the surface area of the crystals is reduced and a crystal having a large grain size is formed.

In this manner, in the exemplary embodiment, pseudo-crystal nuclei with increased free energy exist in the precursor film 2F immediately after film-forming, and thus it is possible to reduce the activation energy of crystallization in the subsequent crystallization annealing. As such, crystals having high density and a small grain size are formed, and sintering of the grains thereof enables the forming of grains having a large grain size.

Next, the method of forming the precursor film having the above-described pseudo-crystal nuclei and the evaluation method thereof shall be described with reference to FIG. 9 to FIG. 11.

Figure 9:
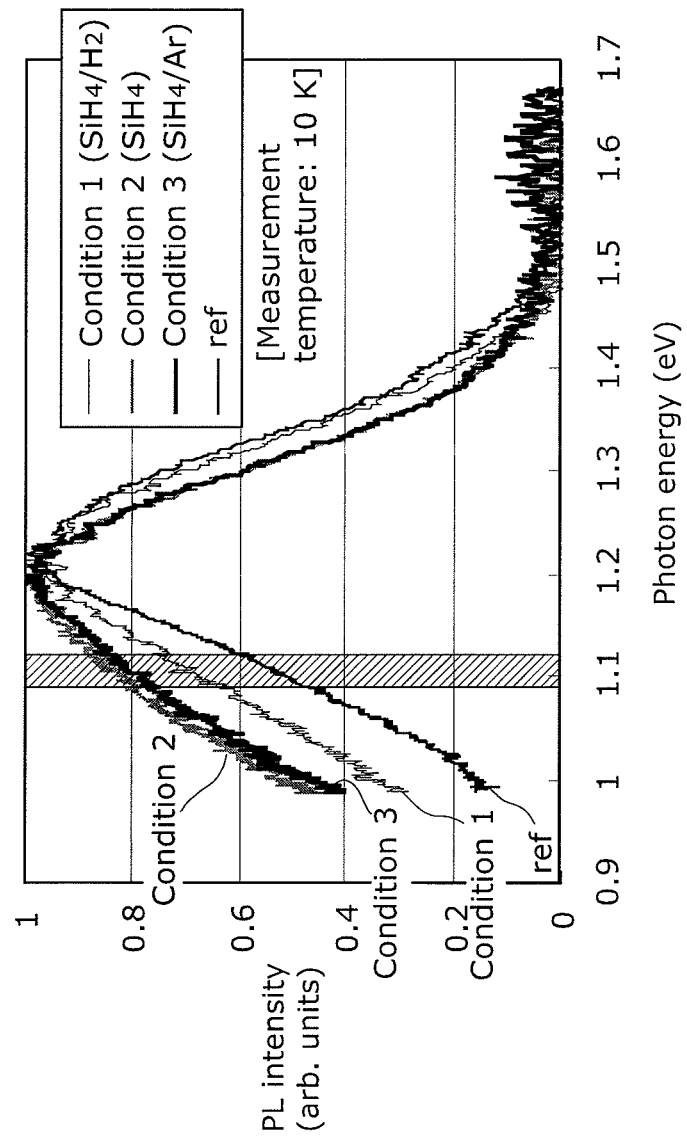
FIG. 9 is a graph showing the photoluminescence (PL) spectra of the precursor films according to the exemplary embodiment and a precursor film according to a comparative example.

FIG. 9 is a graph showing the respective photoluminescence (PL) spectra of the precursor films according to the exemplary embodiment and a precursor film according to a comparative example. The photoluminescence spectra shown in FIG. 9 are normalized such that maximum PL intensity is set to 1. In FIG. 9, the vertical axis denotes PL intensity and the horizontal axis denotes photon energy. FIG. 10 is a table showing film-forming conditions when forming the precursor films under the four conditions in FIG. 9. Condition 1, condition 2, and condition 3 denote film-forming conditions according to the exemplary embodiment, and the condition Ref denotes the film-forming conditions according to the comparative example. Furthermore, FIG. 11 is a schematic diagram for describing a light-emitting mechanism of non-crystalline silicon.

First, the light-emitting process of the precursor film and the change in the PL spectrum associated with such process shall be described with reference to FIG. 11.

Figures 10, 11:
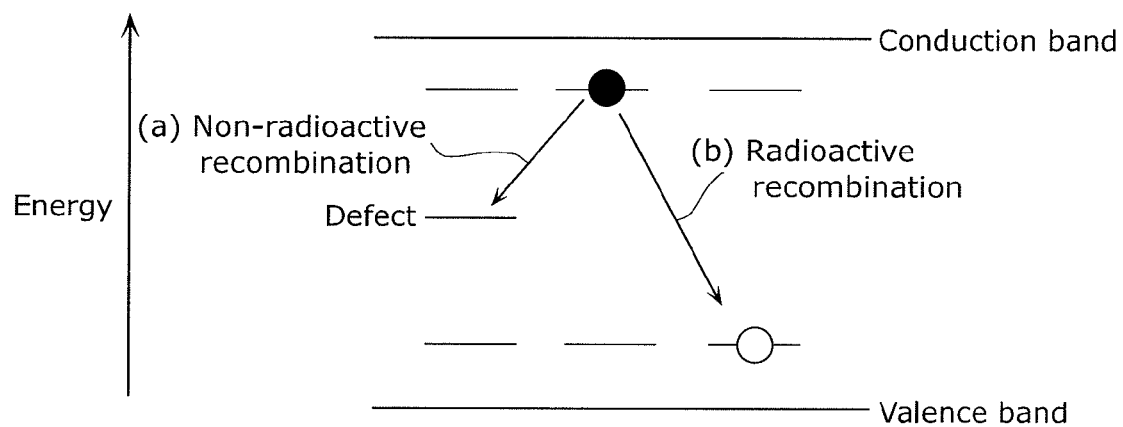
FIG. 10 is a table showing film forming conditions when forming the four precursor films in FIG. 9.
FIG. 11 is a schematic diagram for describing a light-emitting mechanism of non-crystalline silicon.

Since the exciton generated by photoexcitation disappears in the high temperature region due to non-radiative recombination via the localized level formed by the dangling bonds, and so on, of silicon, lowering the temperature results in radiative recombination accompanied by light emission becoming dominant (process (a) in FIG. 11). As such, in the exemplary embodiment, measurement of PL intensity was performed with the measurement temperature at 10 K.

Here, as shown in FIG. 9, the PL spectra of the amorphous silicon films under the respective conditions are observed as broad light emission spectra in which multiple peaks (modes) are present, and there are large peaks at least from 1.2 to 1.4 eV and in the vicinity of 1.1 eV. Of these, the maximum PL intensity appears between 1.2 and 1.4 eV, and in FIG. 9, the peak in the vicinity of 1.2 eV is the maximum PL intensity.

It is possible that this light-emission band is caused by the optical transition between localized levels of band ends including the band tail of the PL spectrum (process (b) in FIG. 11). The shape and location of the peak of the PL spectrum reflects the band end localized level density distribution, that is, the structure of the amorphous silicon film.

As shown in FIG. 9, compared to the PL spectrum according to the comparative example under the condition Ref, the entirety of each of the PL spectra according to the present disclosure under condition 1, condition 2, and condition 3 shifts to the low energy side, that is, the PL intensity of the peak appearing in the vicinity of 1.1 eV is great.

It is thought that, compared to the amorphous silicon film under condition Ref, a region (pseudo-crystal nucleus) having a large amount of bonds between Si atom and Si atom is formed locally in the amorphous silicon films under condition 1 to condition 3. Specifically, it is possible that the PL intensity of the peak appearing when photon energy is in the vicinity of 1.1 eV shows the amount of bonds between Si atom and Si atom, and, the greater the PL intensity at the vicinity of 1.1 eV, the larger the amount of bonds between Si atom and Si atom in the amorphous silicon film.

Therefore, for the PL spectra shown in FIG. 9, by forming an amorphous silicon film having a PL intensity of 0.65 or higher when photon energy is in the vicinity of 1.1 eV, that is, by forming an amorphous silicon film for which the ratio of peak intensity when photon energy is 1.1 eV to maximum PL intensity is 0.65 or higher, it is possible to obtain an amorphous silicon film in which pseudo-crystal nuclei are present.

Accordingly, since it is possible to form a region (pseudo-crystal nucleus) in which the density of bonds between Si atom and Si atom is high locally in the amorphous silicon film which is the precursor film of the crystalline silicon film, the activation energy of crystallization in the crystallization annealing can be reduced, and it is possible to lower the temperature (increase the grain size compared to the grain size at the same crystallization temperature in the conventional method). Therefore, the grain size of the crystalline silicon film formed according to this aspect can be made bigger than the grain size of the crystalline silicon film that has undergone the same crystallization annealing as in the conventional method. Therefore, by manufacturing a TFT having, as a channel layer, the crystalline silicon film formed according to this aspect, it is possible to improve on-state current. Here, "a region in which the density of bonds between Si atom and Si atom is high" refers not to a region in which the crystal grain size is for example 5 nm or several tens of nm or higher, as in polycrystalline silicon or microcrystalline silicon, but to a region in which the density of bonds between Si atom and Si atom that are bonded in a diamond bond structure is high, and in which the density of bonds between Si atom and Si atom having an amorphous structure is less than the bond density for the bonding in the diamond-bond structure.

The bases for the increase in PL intensity in the vicinity of 1.1 eV in the PL spectrum and the formation of the pseudo-crystal nucleus shall be described in detail below with reference to FIG. 12 to FIG. 14, and FIG. 15A to FIG. 15C. It should be noted that, here, discussion is carried out from the viewpoint of the growth temperature dependence of a precursor film (precursor film under condition 3) which is grown using silane gas ($SiH_4$) as a source gas and argon gas (Ar) as a diluent gas. Furthermore, although illustration and description shall be omitted, it has been verified that the same tendencies are indicated more or less even in cases where other gas types are used.

Figure 12:
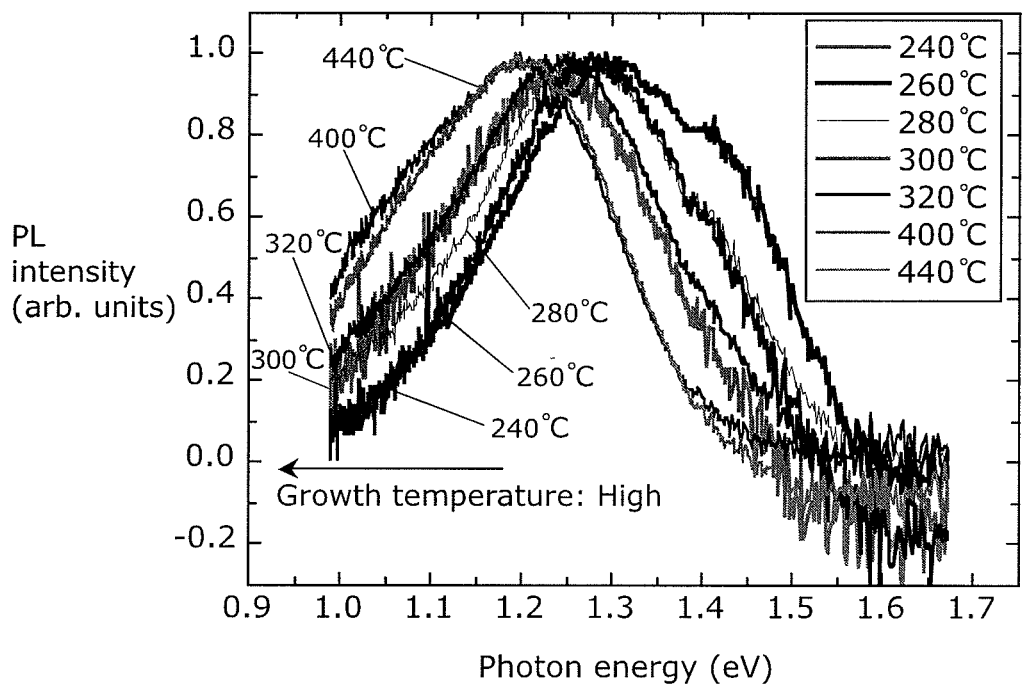
FIG. 12 is a graph showing growth temperature dependence of PL spectra of precursor films in the exemplary embodiment which are grown using an Argon diluent.

FIG. 12 is a graph showing the growth temperature dependence of PL spectra of precursor films (amorphous silicon films) in the exemplary embodiment which are grown using an Ar diluent. FIG. 12 shows photoluminescence spectra that are normalized such that maximum PL intensity is set to 1. In FIG. 12, the vertical axis denotes PL intensity and the horizontal axis denotes the photon energy. It should be noted that in the respective specimens in FIG. 12, film-forming was performed with only the growth temperature being changed and the rest of the growth conditions being the same as in condition 3 shown in FIG. 10.

As shown in FIG. 12, it can be observed that, together with the rise in the growth temperature of the precursor films, the PL spectra as a whole shift to the low energy side. In particular, it can be seen that the shift amount of the PL spectrum is noticeable when film-forming at 400° C. or higher.

Figure 13:
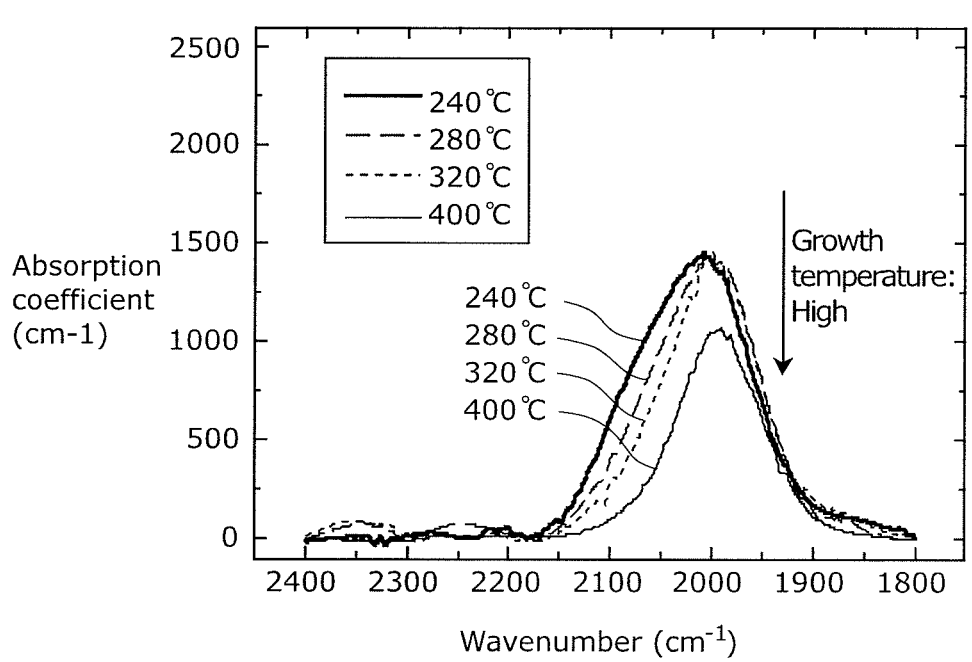
FIG. 13 is a graph showing growth temperature dependence of infrared absorption spectra of precursor films in the exemplary embodiment which are grown using an Argon diluent.

FIG. 13 is a graph showing the growth temperature dependence of infrared absorption spectra of precursor films (amorphous silicon films) in the exemplary embodiment which are grown using an Ar diluent. In FIG. 13, the vertical axis denotes the absorption coefficient and the horizontal axis denotes the wavenumber. It should be noted that in the respective specimens in FIG. 13, film-forming was performed with only the growth temperature being changed and the rest of the growth conditions being the same as in condition 3 shown in FIG. 10.

In FIG. 13, the peak observed when the wavenumber is in the vicinity of 2000 to 2100 cm$^{-1}$ is a peak associated with the Si—H stretching vibration. Qualitatively, it is known that there is a positive correlation between the absorption coefficient of Si—H stretching vibration and the number of Si—H bonds. Therefore, as shown in FIG. 13, it can be seen that, since the maximum (peak) absorption coefficient decreases together with the increase in growth temperature, the number of hydrogen bonds of the precursor films decreases together with the increase in growth temperature.

Figure 14:
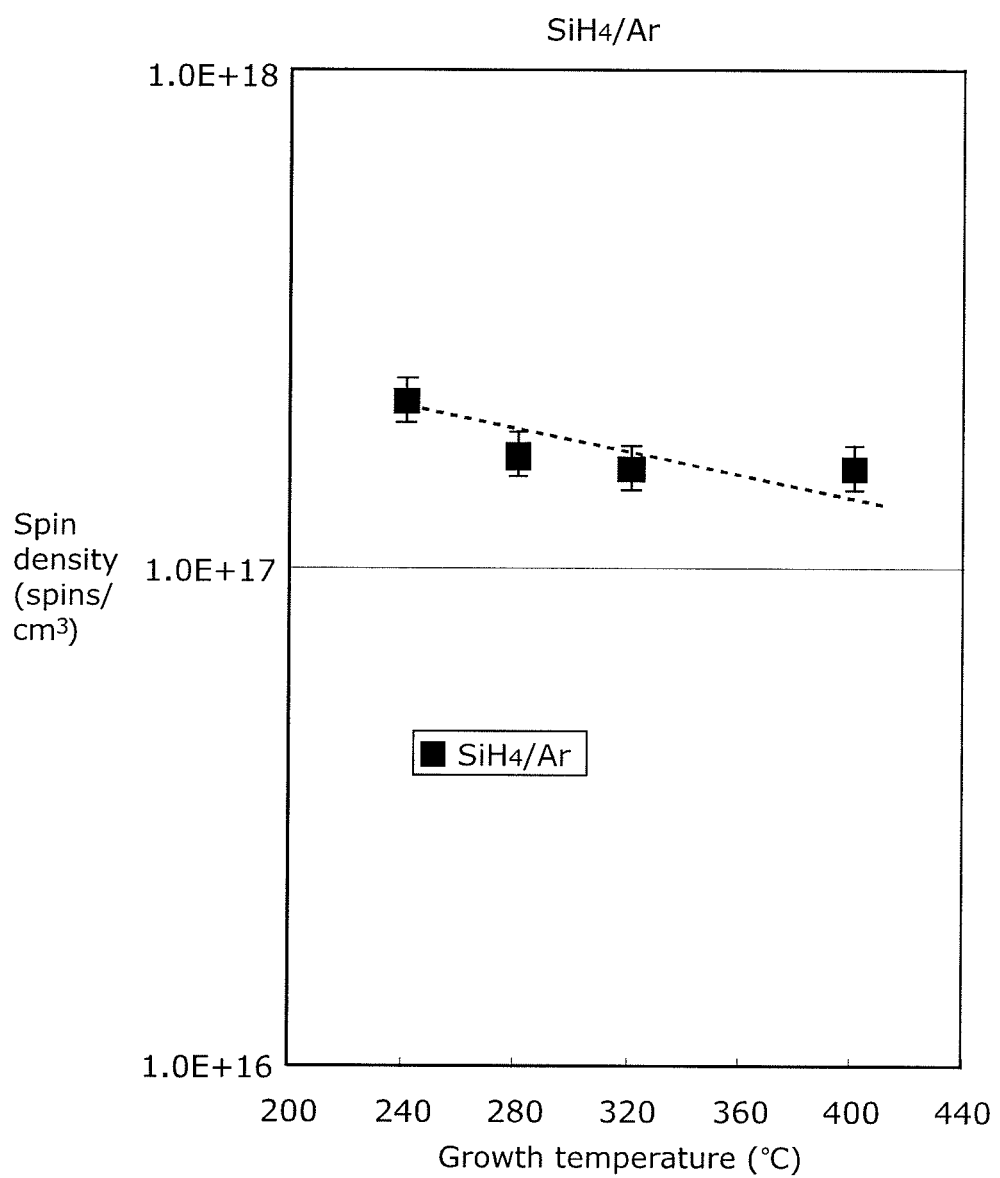
FIG. 14 is a graph showing the growth temperature dependence of spin density of the precursor film in the exemplary embodiment which is grown using an Argon diluent.

FIG. 14 is a graph showing the growth temperature dependence of spin density of the precursor film (amorphous silicon film) in the exemplary embodiment which is grown using an Ar diluent. In FIG. 14, the vertical axis denotes the spin density obtained through the electron spin resonance (ESR) method, and the horizontal axis denotes the growth temperature. It should be noted that in the respective specimens in FIG. 14, film-forming was performed with only the growth temperature being changed and the rest of the growth conditions being the same as in condition 3 shown in FIG. 10.

As shown in FIG. 14, it can be seen that spin density decreases together with the rise in the growth temperature of the precursor films. In other words, it can be seen that a precursor film that is grown at high temperature has a small defect density.

Next, the relationship between the pseudo-crystal nucleus formation and the increase in the PL intensity when the photon energy in the PL spectrum is in the vicinity of 1.1 eV shall be discussed based on the above-described results.

Although the non-crystalline silicon film is made of Si—H bonds and Si—Si bonds, since the Si—H bond is broken and dangling bonds are generated at a temperature of approximately 300° C., normally, a non-crystalline silicon film having a small amount of hydrogen bonds is formed when the temperature is approximately 300° C. or higher. Specifically, in the conventional amorphous silicon film forming method, an amorphous silicon film having many dangling bonds (film having high defect density) is formed.

In contrast, in the amorphous silicon film (precursor film) formed using the amorphous silicon film forming method according to the exemplary embodiment, although it is observed that the hydrogen bond amount decreases together with the increase in growth temperature as shown in FIG. 13, it can be seen that, as shown in FIG. 14, the film has a low defect density regardless of the decrease in the hydrogen bond amount. It is possible that this is because, in the exemplary embodiment, during the growth of the precursor film, Si—Si bonds are formed without forming dangling bonds. Due to the increase in Si—Si bonds, a region (pseudo-crystal nucleus) having a locally increased amount of bonds between Si atom and Si atom is formed. In addition, it is observed that, since this pseudo-crystal nucleus causes the Si band end light-emission, light emission when photon energy is in the vicinity of 1.1 eV increases as shown in FIG. 9.

It should be noted that there is a report that, in the PL spectrum of the non-crystalline silicon film, the light emission in the vicinity of 1.1 eV appears due to oxygen deficiency. However, in the present disclosure, it is verified that, in the IR spectrum, Si—O bonds corresponding to the aforementioned light emission do not exist in the non-crystalline silicon film, and it is possible that the light emission in the vicinity of 1.1 eV shown in FIG. 9 is light emission caused by the above-described pseudo-crystal nucleus.

Figure 15A:
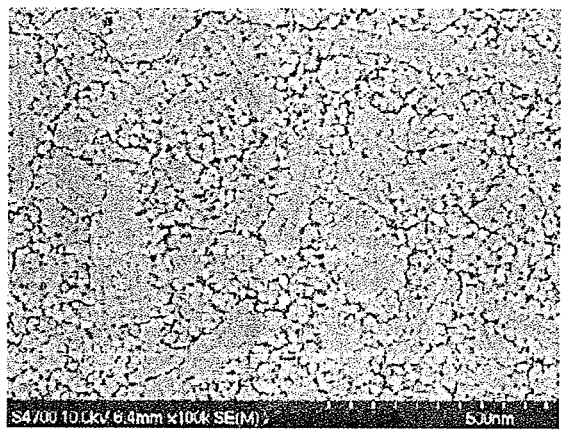
FIG. 15A is a planar SEM image of a crystalline silicon film formed using a precursor film under condition 1 according to the exemplary embodiment.
Figure 15B:
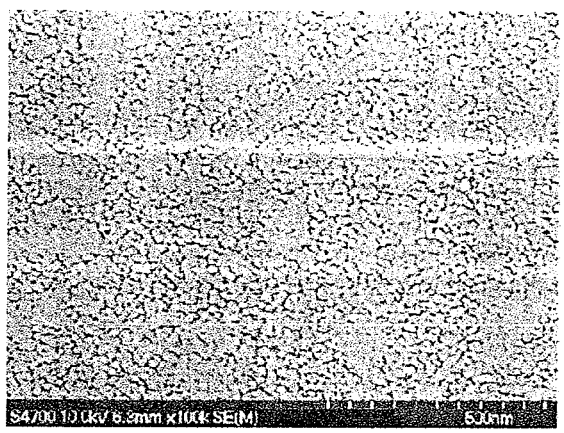
FIG. 15B is a planar SEM image of a crystalline silicon film formed using a precursor film under condition 2 according to the exemplary embodiment.
Figure 15C:
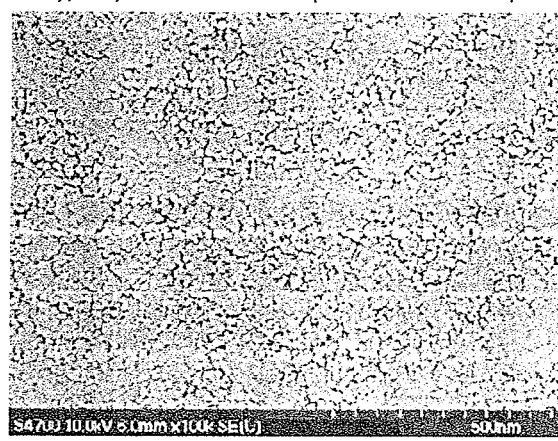
FIG. 15C is a planar SEM image of a crystalline silicon film formed using a precursor film under condition 3 according to the exemplary embodiment.

Next, the average grain size of crystalline silicon films that were actually formed using the precursor films under condition 1 to condition 3 shown in FIG. 10 shall be described with reference to FIG. 15A to FIG. 15C. FIG. 15A to FIG. 15C are planar SEM images of crystalline silicon films formed using the respective precursor films under condition 1 to condition 3. FIG. 15A corresponds to condition 1, FIG. 15B to condition 2, and FIG. 15C to condition 3. It should be noted that, for the crystallization annealing, thermal processing for 20 minutes at a crystallization temperature of 750° C. using the thermal annealing method was performed. Furthermore, the thickness of the precursor film (amorphous silicon film) before crystallization is approximately 50 nm.

As shown in FIG. 15A to 15C, the average grain size of the crystalline silicon film using the precursor film under condition 1 is 75 nm, the average grain size of the crystalline silicon film using the precursor film under condition 2 is 90 nm, the average grain size of the crystalline silicon film using the precursor film under condition 3 is 124 nm, and thus it can be seen that in all of these cases, the average grain size is bigger than the average grain size (30 nm) of the crystalline silicon film formed using the conventional method shown in FIG. 30B.

Figure 16:
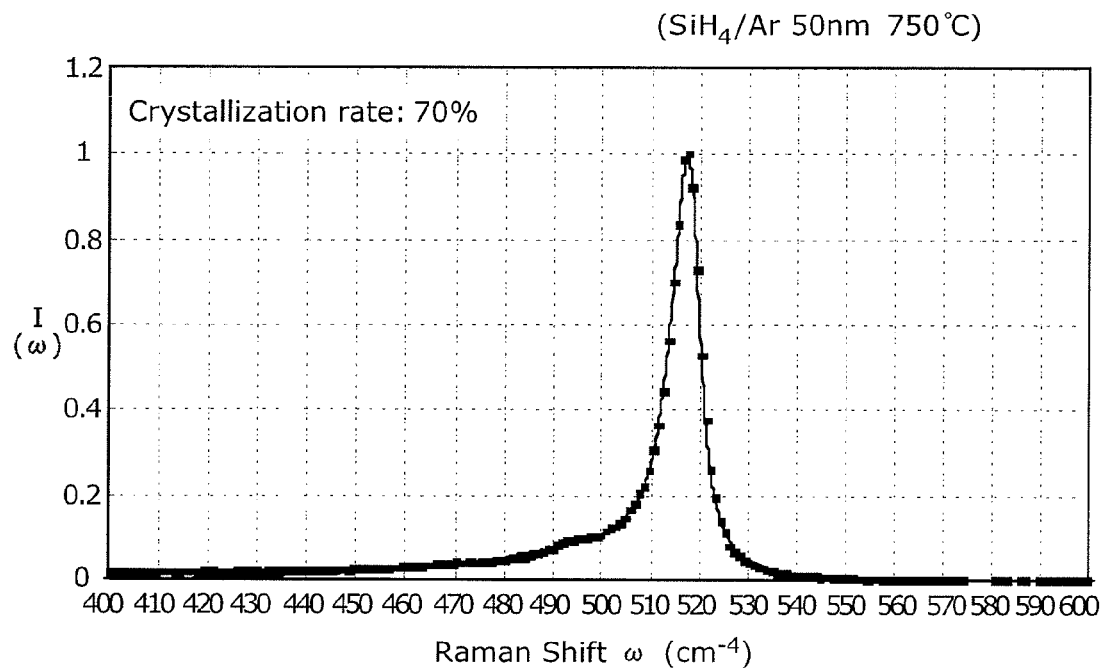
FIG. 16 is a graph showing a Raman spectrum according to a Raman spectroscopic analysis of the specimen in FIG. 15C.

Furthermore, FIG. 16 shows a Raman spectrum according to a Raman spectroscopic analysis of the specimen in FIG. 15C. As shown in FIG. 16, the sintered structure in the present disclosure has a 70% crystallization rate (=crystal component intensity $(I_{c-Si}+I_{m-Si})$/(crystal component intensity $(I_{c-Si}+I_{m-Si})$+amorphous component intensity $(I_{a-Si}))$). Here, crystallinity is improved compared to the crystallization rate (40%) of the conventional short-time SPC structure and the crystallization rate (60%) of the conventional explosive structure. Therefore, the sintered structure in the present disclosure can realize crystallinity at par with that of molten polysilicon, using short-time thermal annealing. It should be noted that it is preferable that the crystallization rate of the sintered structure in the present disclosure be between 65% and 85%, inclusive.

Furthermore, as shown in the figure, it can be seen that the average grain size of the respective crystalline silicon films under condition 1 to condition 3 increases in the sequence of condition 1 (75 nm), condition 2 (90 nm), and condition 3 (124 nm).

Figure 17:
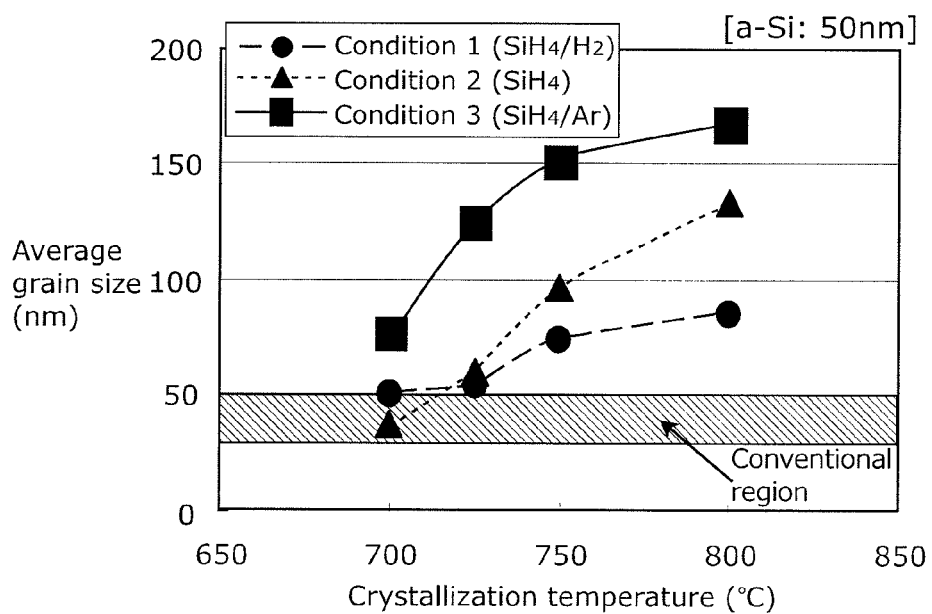
FIG. 17 is a graph showing the relationship between the crystallization temperature and the crystal grain size of crystalline silicon films according to the exemplary embodiment.
Figure 18A:
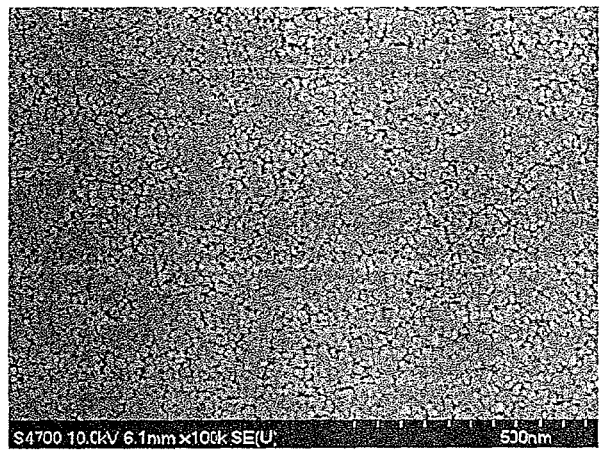
FIG. 18A is a planar SEM image of a crystalline silicon film formed using a precursor film (thickness: 30 nm) under condition 3 according to the exemplary embodiment.
Figure 18B:
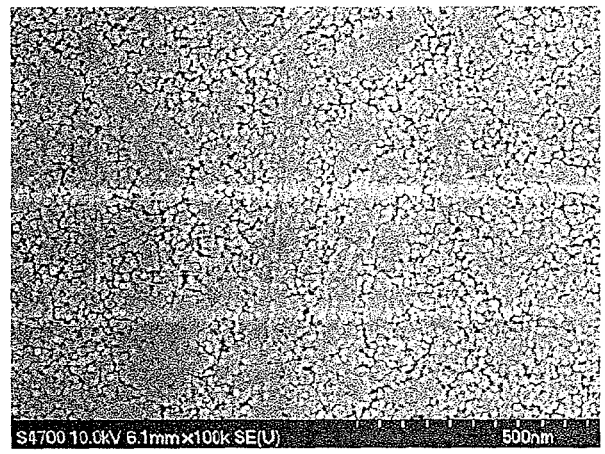
FIG. 18B is a planar SEM image of a crystalline silicon film formed using a precursor film (thickness: 40 nm) under condition 3 according to the exemplary embodiment.
Figure 18C:
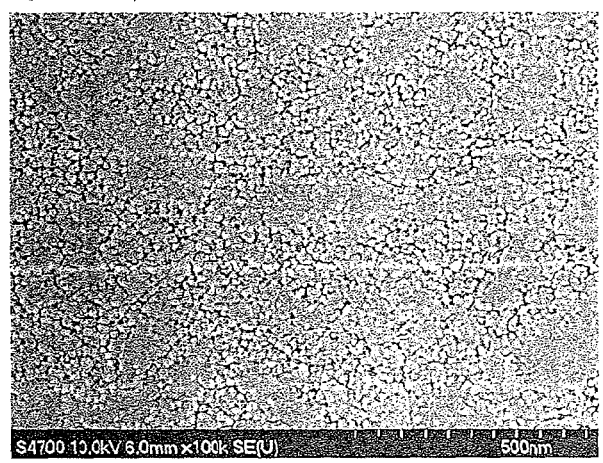
FIG. 18C is a planar SEM image of a crystalline silicon film formed using a precursor film (thickness: 50 nm) under condition 3 according to the exemplary embodiment.
Figure 18D:
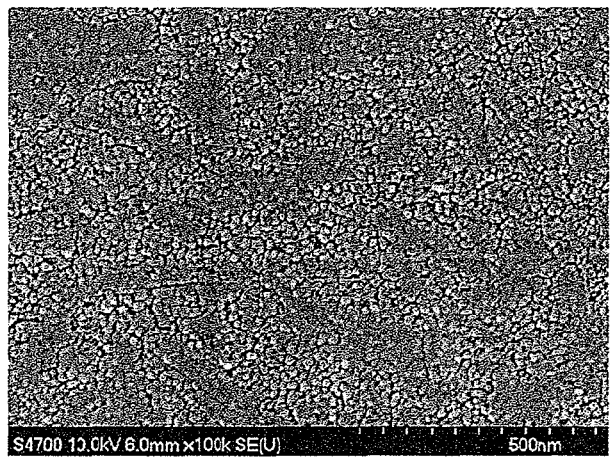
FIG. 18D is a planar SEM image of a crystalline silicon film formed using a precursor film (thickness: 70 nm) under condition 3 according to the exemplary embodiment.

Next, the relationship between the crystallization temperature and the crystal grain size of the crystalline silicon films formed using the precursor films under condition 1 to condition 3 shall be described with reference to FIG. 17. FIG. 17 is a graph showing the relationship between the crystallization temperature and the crystal grain size of crystalline silicon films according to the exemplary embodiment. It should be noted that, in FIG. 17, the vertical axis denotes the average grain size obtained from the planar SEM, and the horizontal axis denotes the crystallization temperature. Furthermore, for the crystallization annealing, thermal processing for 20 minutes using the thermal annealing method was performed. Furthermore, the thickness of the precursor films (amorphous silicon films) before crystallization is approximately 50 nm.

As shown in FIG. 17, whereas a film with an average grain size of approximately 30 to 50 nm was the limit in the conventional crystalline silicon film forming method, it is verified that, compared to the crystalline silicon film formed using the conventional method, it is possible to increase grain size in the crystalline silicon films formed using the precursor films according to the exemplary embodiment. For example, at a crystallization temperature of 750° C., the average grain size of the crystalline silicon film formed under condition 3 is approximately 3 to 5 times the average grain size of the crystalline silicon film formed using the conventional method.

Furthermore, as shown in the figure, it can be seen that the average grain size of the crystalline silicon films formed using the precursor films according to the exemplary embodiment under condition 1 to condition 3 generally increases in the sequence of condition 3, condition 2, and condition 1. Furthermore, the average grain size of the crystalline silicon film formed under condition 1 is approximately twice the average grain size of the crystalline silicon film formed using condition 2.

Next, the relationship between the thickness of the precursor film and the grain size of the crystalline silicon film according to the present disclosure shall be described with reference to FIG. 18A to FIG. 18D. FIG. 18A to FIG. 18D show planar SEM images of crystalline silicon films formed using precursor films having a thickness of 30 nm, 40 nm, 50 nm, and 70 nm, under condition 3 of the exemplary embodiment in the disclosure. Here, these crystalline silicon films are manufactured using crystallization annealing for 20 minutes at 750° C. As shown in FIG. 18A to FIG. 18D, it can be seen that the average grain size of the crystalline silicon films increase together with the increase in the thickness of the precursor films, despite the precursor growth conditions and the crystallization annealing conditions being the same. Based on SEM image observation, it can be seen that this increase in crystal grain size is caused by the increase in the size and density of the sintered structure.

Figure 19:
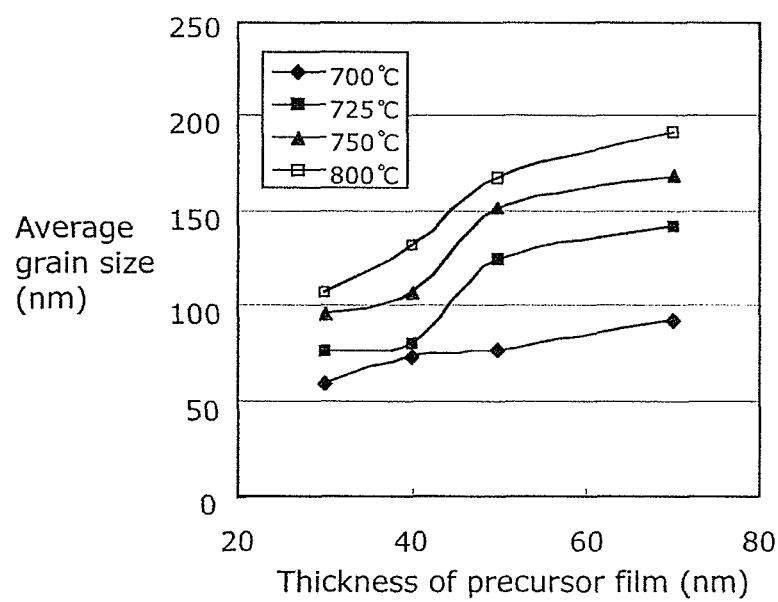
FIG. 19 is a graph showing the precursor film thickness dependence of the crystal grain size of the crystalline silicon films according to the exemplary embodiment.

Furthermore, FIG. 19 is a graph showing the precursor film thickness dependence of the crystal grain size (calculated from the SEM images) of the crystalline silicon films according to the exemplary embodiment. Here, for the crystallization annealing of the precursor films, processing was performed for 20 minutes at 700° C., 725° C., 750° C., and 800° C. Furthermore, all the precursor films were formed under condition 3. As shown in FIG. 19, it can be seen that, regardless of the crystallization temperature, the average grain size increases together with the increase in thickness of the precursor film. Furthermore, a tendency for the amount of increase in the average grain size to increase when the thickness of the precursor film exceeds 40 nm and to become saturated when the film thickness exceeds 70 nm is observed.

Figure 20:
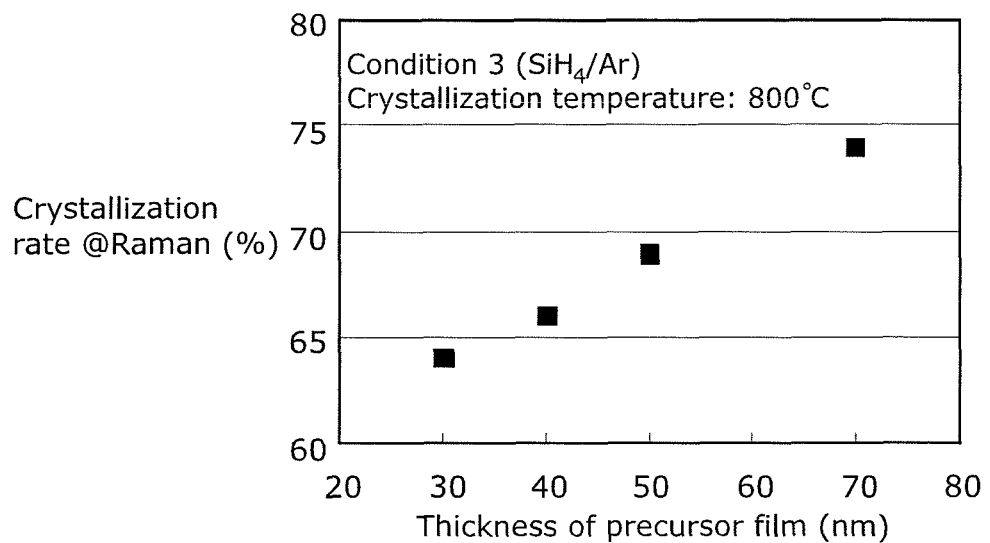
FIG. 20 is a graph showing the precursor film thickness dependence of the crystallization rate of the crystalline silicon film according to the exemplary embodiment calculated from Raman spectrometry results.

In addition, FIG. 20 shows the precursor film thickness dependence of the crystallization rate calculated from Raman spectrometry results. Here, the precursor film is formed under condition 3, and for the crystallization annealing, processing was performed for 20 minutes at 800° C. As shown in FIG. 20, it can be seen that the crystallization rate increases almost monotonically together with the increase in thickness of the precursor film. Accordingly, it is possible that the changing into the sintered structure in the present disclosure progresses together with the increase in the thickness of the precursor film.

As described above, it is understood that there is a correlation between the thickness of the precursor film and the average grain size of the sintered structure in the present disclosure. Although the detailed mechanism is not clear at present, the subsequent model is speculated. In the short-time SPC structure, grains having a grain size of 30 nm are formed. When the thickness of the crystalline silicon film exceeds the grain size of the short-time SPC structure (for example, the vicinity of 40 nm), the influence of surface area on volume increases, and thus sintering of short-time SPC grains progresses so as to reduce the surface energy. On the other hand, since the amount of change of the surface area with respect to volume becomes a fixed value when the thickness of the crystalline silicon film reaches or exceeds a certain level (for example 100 nm), it is speculated that the increase of the sintered structure becomes saturated.

As described above, according to the crystalline silicon film forming method according to the exemplary embodiment, it is possible to cause the generation of pseudo-crystal nuclei inside a precursor film (amorphous silicon film) of a crystalline silicon film, and thus it is possible to reduce the activation energy of the crystallization in the crystallization annealing. As such, crystals having small grain size grow with high density, and sintering of the crystal grains occurs so that surface energy in the crystalline silicon film is minimized. With this, it is possible to lower the crystallization temperature of the amorphous silicon film (increase the grain size compared to the grain size for the same crystallization temperature of the conventional method). Accordingly, it is possible to have a crystalline silicon film having first crystals and second crystals, where the first crystals are formed by the sintering of second crystals and have an average crystal grain size bigger than the second crystals, and the second crystals have an average grain size smaller than the first crystals.

Furthermore, according to the crystalline silicon film forming method according to the exemplary embodiment, a crystallization temperature of 800° C. or lower allows forming of a crystalline silicon film in which the average grain size of the crystal within the film is from 30 nm to 300 nm.

Furthermore, according to the crystalline silicon film forming method according to the exemplary embodiment, increasing the thickness of the precursor film allows the grain size of the crystalline silicon film to be increased.

It should be noted that in the crystalline silicon film forming method according to the exemplary embodiment, in order to form a precursor film in which a pseudo-crystal nuclei exist, it is effective to reduce the hydrogen content inside the film.

As one specific method, it is sufficient to raise the growth temperature. This is because the amount of hydrogen inside the film can be reduced further as the growth temperature is raised, as apparent in the results in FIG. 13. In this case, it is preferable to set the growth temperature of the precursor film from 350° C. to 500° C.

Furthermore, as a different method, there is a method that causes stable generation of plasma at the time of film-forming, and, here, it is sufficient to use an easily-ionized noble gas as the diluent gas. In this case, the precursor film is formed using, for example, a diluent gas that does not contain hydrogen.

In addition, as a different method, there is a method of forming a precursor film using high power density. This is because using high power density allows plasma density to be increased, and further breaking down the source gas allows the amount of bonds between Si atom and Si atom to be increased. It is preferable that the precursor film be formed with the RF power density being in the range of 0.1 to 0.5 W/cm$^2$, inclusive.

Here, comparing condition 2 and condition 3 in the exemplary embodiment, it can be seen that even though condition 2 is higher than condition 3 with regard to the PL intensity in the vicinity of 1.1 eV of the PL spectra as shown in FIG. 9, grain size grows larger more under condition 3 than under condition 2 as shown in FIG. 15B and FIG. 15C. The reason for this is speculated to be as follows.

Based on the PL spectra in FIG. 9, there is a larger amount of bonds between Si atom and Si atom, that is, pseudo-crystal nuclei density is higher under condition 2 compared to condition 3. Here, in solid phase crystallization, in order to grow crystals into a larger grain size, it is necessary to extend the mean free path of the Si atoms inside the non-crystalline silicon film. However, it is stipulated that, grain size does not grow big because the probability that an Si atom will collide with a crystal nucleus becomes high, that is, the mean free path becomes short when pseudo-crystal nuclei density becomes high. It is possible that grain size grows big more under condition 3 than condition 2 due to this reason.

Therefore, based on this, for the precursor film in the present disclosure, it is preferable that, in the PL spectra in FIG. 9, the PL intensity when photon energy is in the vicinity of 1.1 eV be not much larger than approximately 0.8. Specifically, when the there are too many regions in which the density of bonds between Si atom and Si atom is locally high within the non-crystalline silicon film, this becomes an obstacle to the growth of crystal grain size, and thus it is preferable that the PL intensity of the amorphous silicon film when the photon energy is 1.1 eV be kept to 0.8 or lower. Accordingly, the crystallization activation energy reducing effect of the region having a high density of bonds between Si atom and Si atom can be reliably manifested.

As described above, according to the crystalline silicon film forming method according to the exemplary embodiment, by forming an amorphous silicon film for which the PL intensity when photon energy is 1.1 eV is 0.65 or higher, it is possible to generate pseudo-crystal nuclei in the amorphous silicon film which is the precursor film of the crystalline silicon film. This allows lowering of the crystallization temperature during crystallization of the amorphous silicon film. As a result, it is possible to manufacture a crystalline silicon film having good crystallinity, using a process that is simple and allows increase in size.

(Structure of Semiconductor Device)

Hereinafter, an embodiment of a semiconductor device (thin-film transistor) formed using the crystalline silicon film formed according to the above-described crystalline silicon film forming method shall be described.

The thin-film transistor according to the exemplary embodiment includes a gate electrode, a gate insulating film, a crystalline silicon film, and a drain electrode. The crystalline silicon film is a crystalline silicon film formed according to the above-described crystalline silicon film forming method.

In the semiconductor device according to the exemplary embodiment, the crystalline silicon film is used as a channel layer and is formed between the gate electrode and the gate insulating film. Hereinafter, more specific configurations of the semiconductor device according to the exemplary embodiment shall be described with reference to the Drawings.

(Bottom-gate TFT configuration)

First, the configurations of 4 types of bottom-gate TFTs according to the exemplary embodiment shall be described with reference to FIG. 21A to FIG. 21D.

Figure 21A:
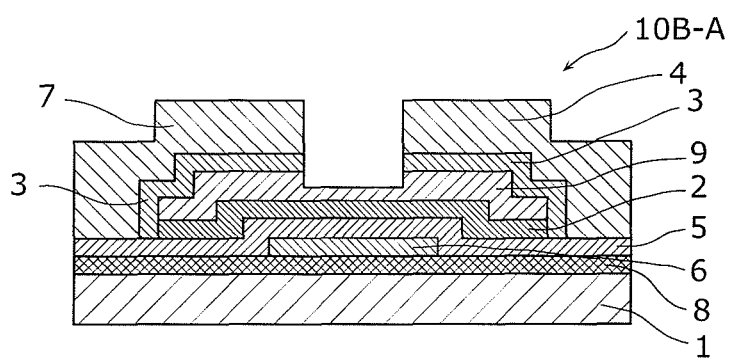
FIG. 21A is a cross-sectional view of a first bottom-gate TFT 10B-A according to the exemplary embodiment.

FIG. 21A is a cross-sectional view that schematically illustrates the configuration of a first bottom-gate TFT 10B-A according to the exemplary embodiment. The structure in FIG. 21A is a channel edge structure that is formed by etching a semiconductor layer (here, a non-crystalline silicon film 9) during the forming of a source region and a drain region.

As shown in FIG. 21A, the first bottom-gate TFT 10B-A includes: a substrate 1; a gate electrode 6 formed above the substrate 1; a gate insulating film 5 formed on the gate electrode 6; a crystalline silicon film 2 formed on the gate insulating film 5; and a source electrode 4 and a drain electrode 7 which are formed above the crystalline silicon film 2. The crystalline silicon film 2 is formed according to the crystalline silicon film forming method according to the exemplary embodiment, described above.

In addition, the first bottom-gate TFT 10B-A includes: an undercoat layer 8 formed on the upper surface of the substrate 1; a non-crystalline silicon layer 9 formed on the crystalline silicon film 2; and a pair of contact layers 3 formed on the non-crystalline silicon layer 9.

Figure 21B:
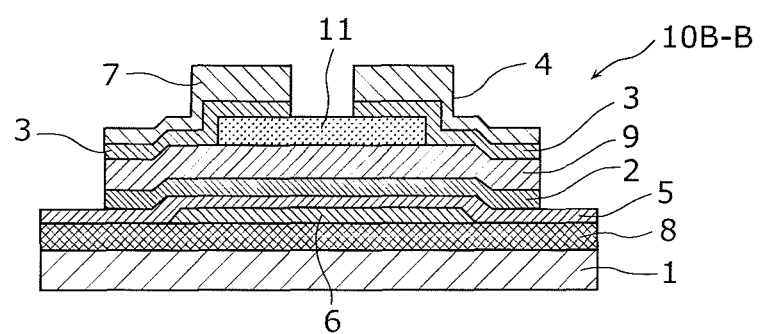
FIG. 21B is a cross-sectional view of a second bottom-gate TFT 10B-B according to the exemplary embodiment.
Figure 21C:
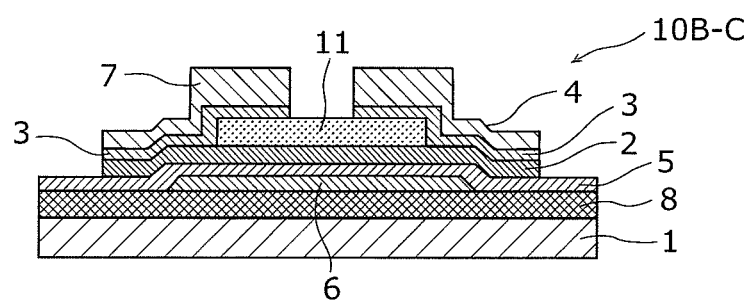
FIG. 21C is a cross-sectional view of a third bottom-gate TFT 10B-C according to the exemplary embodiment.
Figure 21D:
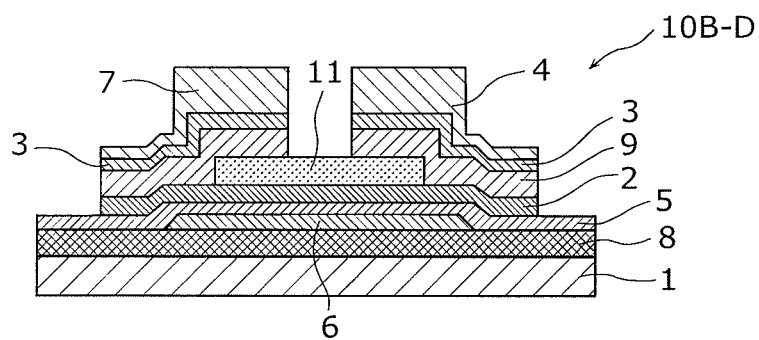
FIG. 21D is a cross-sectional view of a fourth bottom-gate TFT 10B-D according to the exemplary embodiment.

Furthermore, FIG. 21B, FIG. 21C, and FIG. 21D are cross-sectional views schematically showing the configuration of a second bottom-gate TFT 10B-B according to the exemplary embodiment, the configuration of a third bottom-gate TFT 10B-C according to the exemplary embodiment, and the configuration of a fourth bottom-gate TFT 10B-D according to the exemplary embodiment, respectively. The respective structures in FIG. 21B to FIG. 21D are channel etch-stop structures in which a channel protecting film 11 is formed to protect a semiconductor region from being etched during the forming of a source region and a drain region.

The following points are the differences among the respective structures in FIG. 21B to FIG. 21D. A point of difference is that, in FIG. 21B, the non-crystalline silicon layer 9 is formed in between the crystalline silicon film 2 and the channel protecting film 11, whereas, in FIG. 21C, the non-crystalline silicon layer 9 is not formed. Furthermore, in FIG. 21D, the point of difference is that the non-crystalline silicon layer 9 is formed on the channel protecting film 11 (between the channel protecting film 11 and the contact layers 3). The configuration in FIG. 21B shall be described in detail below as an example.

As shown in FIG. 21B, the second bottom-gate TFT 10B-B includes: the substrate 1; the gate electrode 6 formed above the substrate 1; the gate insulating film 5 formed on the gate electrode 6; the crystalline silicon film 2 formed on the gate insulating film 5; and the pair of the source electrode 4 and the drain electrode 7 formed above both ends of the crystalline silicon film 2.

In addition, the second bottom-gate TFT 10B-B includes: the undercoat layer 8 formed on the upper surface of the substrate 1; the non-crystalline silicon layer 9 formed on the crystalline silicon film 2; the channel protecting film 11 formed on the non-crystalline silicon layer 9; and the pair of contact layers 3 formed on both ends of the non-crystalline silicon layer 9 and covering both ends of the channel protecting film 11.

Even in the second bottom-gate TFT 10B-B, the crystalline silicon film 2 is formed according to the crystalline silicon film forming method according to the exemplary embodiment, described above.

The respective constituent elements of the second bottom-gate TFT 10B-B according to the exemplary embodiment shall be described in detail below.

The substrate 1 is, for example, a glass substrate made of a glass material such as quartz glass, alkali-free glass, highly heat-resistant glass, and so on.

The undercoat layer 8 is formed on the substrate 1 to prevent impurities, such as natrium, phosphorus, etc., included in the glass substrate from invading the crystalline silicon film 2. As the undercoat layer 8, it is possible to use, for example, a silicon nitride film ($SiN_x$), a silicon oxide film ($SiO_x$), a silicon oxynitride film (SiON), and so on. The thickness of the undercoat film 8 is, for example, approximately 100 to 2000 nm.

The gate electrode 6 is configured of a single-layer structure or a multi-layer structure of a conductive material or an alloy thereof, and so on, and is patterned in a predetermined shape on the substrate 1 using, for example, molybdenum (Mo), aluminum (Al), copper (Cu), tungsten (W), titanium (Ti), chromium (Cr), molybdenum-tungsten (MoW), and so on. It should be noted that the thickness of the gate electrode 6 is, for example, approximately 20 to 500 nm.

The gate insulating film 5 is configured of, for example, a silicon oxide film (SiOX), a silicon nitride film ($SiN_x$), a silicon oxynitride film (SiON), an aluminum oxide ($AlO_x$), a tantalum oxide ($TaO_x$), a stacked film thereof, or the like, and is formed covering the substrate 1 above which the gate electrode 6 is formed. In other words, the gate insulating film 5 is formed above the substrate 1 to cover the gate electrode 6. In the exemplary embodiment, for example, a silicon oxide film is used as the gate insulating film 5 because the crystalline silicon film 2 is used. This is because it is good to have a good interface between the crystalline silicon film 2 and the gate insulating film 5 in order to maintain good threshold voltage characteristics in the TFT, and a silicon oxide film is suitable for this. It should be noted that the thickness of the gate insulating film 5 is, for example, approximately 50 to 300 nm.

The crystalline silicon film 2 is formed on the gate insulating film 5 and has a channel region which is a region in which the movement of carriers is controlled according to the voltage of the gate electrode 6. The crystalline silicon film 2 in the exemplary embodiment is a polycrystalline silicon film formed by crystallizing the amorphous silicon film which is the precursor film in which pseudo-crystal nuclei exist and which is formed using the above-described forming method. This polycrystalline silicon film has a mixed-crystal structure of amorphous silicon and crystalline silicon. It should be noted that, for example, in order to obtain excellent on-characteristics, at least a predetermined channel region of the crystalline silicon film 2 is configured of a film having a large percentage of crystalline silicon. The thickness of the crystalline silicon film 2 is, for example, approximately 20 to 100 nm, and the grain size of the crystalline silicon inside the crystalline silicon film 2 is, for example, approximately 5 to 1000 nm. Furthermore, since volume generally changes due to expansion when the structure changes from non-crystalline to crystalline, the effect of protrusions formed on the surface of the crystalline silicon film increases when the grain size of the crystalline silicon increases. In order to reduce the effects of these protrusions, it is preferable that the grain size of the crystalline silicon be 300 nm or less.

The non-crystalline silicon layer 9 is made from an amorphous silicon film formed on the crystalline silicon film 2, and is an i-layer on which intentional impurity doping is not performed. Therefore, the non-crystalline silicon layer 9 has a high electrical resistance compared to the impurity-doped contact layers 3. It should be noted that although impurity doping was not performed, naturally included impurities exist in the non-crystalline silicon layer 9. The impurity concentration of the non-crystalline silicon layer 9 is $1 \times 10^{17}$ [atm/cm$^3$] or lower.

The introduction of the non-crystalline silicon layer 9 is aimed at reducing the off-current by introducing a material having a larger bandgap than the crystalline silicon film 2. For the non-crystalline silicon layer 9, it is preferable to use a material having a bandgap of 1.60 to 1.90 eV. It should be noted that the thickness of the non-crystalline silicon layer 9 is, for example, approximately 10 to 100 nm.

The channel protecting film 11 is a protective film that protects the channel layer of the crystalline silicon film 2, and is formed above the crystalline silicon film 2. In the exemplary embodiment, the channel protecting film 11 functions as a channel etching stopper (CES) for protecting the channel region of the crystalline silicon film 2 from being etched during the etching when the pair of contact layers 3 are formed. In other words, the upper part of the channel protecting film 11 is etched due to the etching during the forming of the contact layers 3.

Furthermore, the channel protecting film 11 is an organic material layer made of an organic material containing, as a main component, silicon, oxygen, and carbon, or an inorganic material layer having, as a main component, an inorganic material such as a silicon oxide, a silicon nitride, or the like. It should be noted that the channel protecting film 11 has insulation properties, and thus the pair of contact layers 3 are not electrically connected.

The pair of contact layers 3 are made of an amorphous semiconductor layer containing a high concentration of impurity, and are formed above the channel region of the crystalline silicon film 2 via the channel protecting film 11. Furthermore, the pair of contact layers 3 are arranged opposite each other across a predetermined gap.

In the exemplary embodiment, each of the pair of contact layers 3 is formed to straddle the channel protecting film 11 and the non-crystalline silicon layer 9, and is formed to cover the top and side face of the channel protecting film 11 and the upper surface of the non-crystalline silicon layer 9. Furthermore, the pair of contact layers 3 are n-type semiconductor layers formed by doping phosphorous (P) in an amorphous silicon film as an impurity, and are n$^+$ layers having a high impurity concentration of not less than $1 \times 10^{19}$ [atm/cm$^3$]. It should be noted that the thickness of the contact layers 3 is, for example, approximately 5 to 100 nm.

Furthermore, a layer having a lower impurity concentration than the contact layers 3 may further be introduced between the non-crystalline silicon layer 9 and the contact layers 3. Furthermore, the impurity of the contact layers 3 may form a profile in which concentration decreases towards the non-crystalline silicon layer 9. As with the above, by designing such that the change in the impurity concentration profile between the non-crystalline silicon layer 9 and the contact layers 3 becomes gradual, the electric field at the drain region is mitigated and the off-current is further reduced.

Each of the pair of the source electrode 4 and the drain electrode 7 is formed above the channel region of the crystalline silicon film 2 via the channel protecting film 11, and in the exemplary embodiment, is formed above a corresponding one of the pair of contact layers 3. Furthermore, the source electrode 4 and the drain electrode 7 are arranged opposite each other across a predetermined gap.

In the exemplary embodiment, each of the source electrode 4 and the drain electrode 7 is a single-layer structure or multilayer structure that is made of conductive materials, an alloy thereof, or the like, and is made of, for example, conductive materials such as aluminum (Al), molybdenum (Mo), tungsten (W), copper (Cu), titanium (Ti), chromium (Cr), and so on. In the exemplary embodiment, the source electrode 4 and the drain electrode 7 are each formed from a MoW/Al/Mo three-layer structure. It should be noted that the thickness of the source electrode 4 and the drain electrode 7 is, for example, approximately 100 to 500 nm.

As described above, according to the semiconductor device according to the exemplary embodiment, the crystalline silicon film 2 which is a channel layer is formed having, as a precursor film, a non-crystalline silicon film in which pseudo-crystal nuclei exist inside the film, and thus it is possible to reduce the activation energy of the crystallization in the crystallization annealing. Therefore, the grain size of the crystalline silicon film 2 in the exemplary embodiment can be made bigger than the grain size of the crystalline silicon film formed through the same crystallization annealing as in the conventional method. Accordingly, the semiconductor device according to the exemplary embodiment allows improvement of on-state current compared to the conventional semiconductor device. As a result, it is possible to realize a bottom-gate TFT that can be used as a pixel circuit TFT of a high-definition display device or an organic EL display device.

Furthermore, since protrusions are present in the grain boundary parts in the crystalline silicon film formed using the conventional LA method, when a thin-film transistor is manufactured using the crystalline silicon film of the conventional LA method, there is non-uniformity in the thickness of the film formed in a layer above the crystalline silicon film, and thus there is unevenness in element characteristics and a negative effect on reliability. In contrast, in the crystalline silicon film in the present disclosure, the intragranular flatness of the first crystals includes the undulations originating from the second crystals. In other words, the first crystals have an intra-granular roughness originating from the second crystals. Accordingly, the thickness of the film formed on a layer above the crystalline silicon film has excellent uniformity, and it is possible to realize a thin-film transistor which has excellent reliability and no unevenness in element characteristics.

(Bottom-Gate TFT Manufacturing Method)

Figure 22:
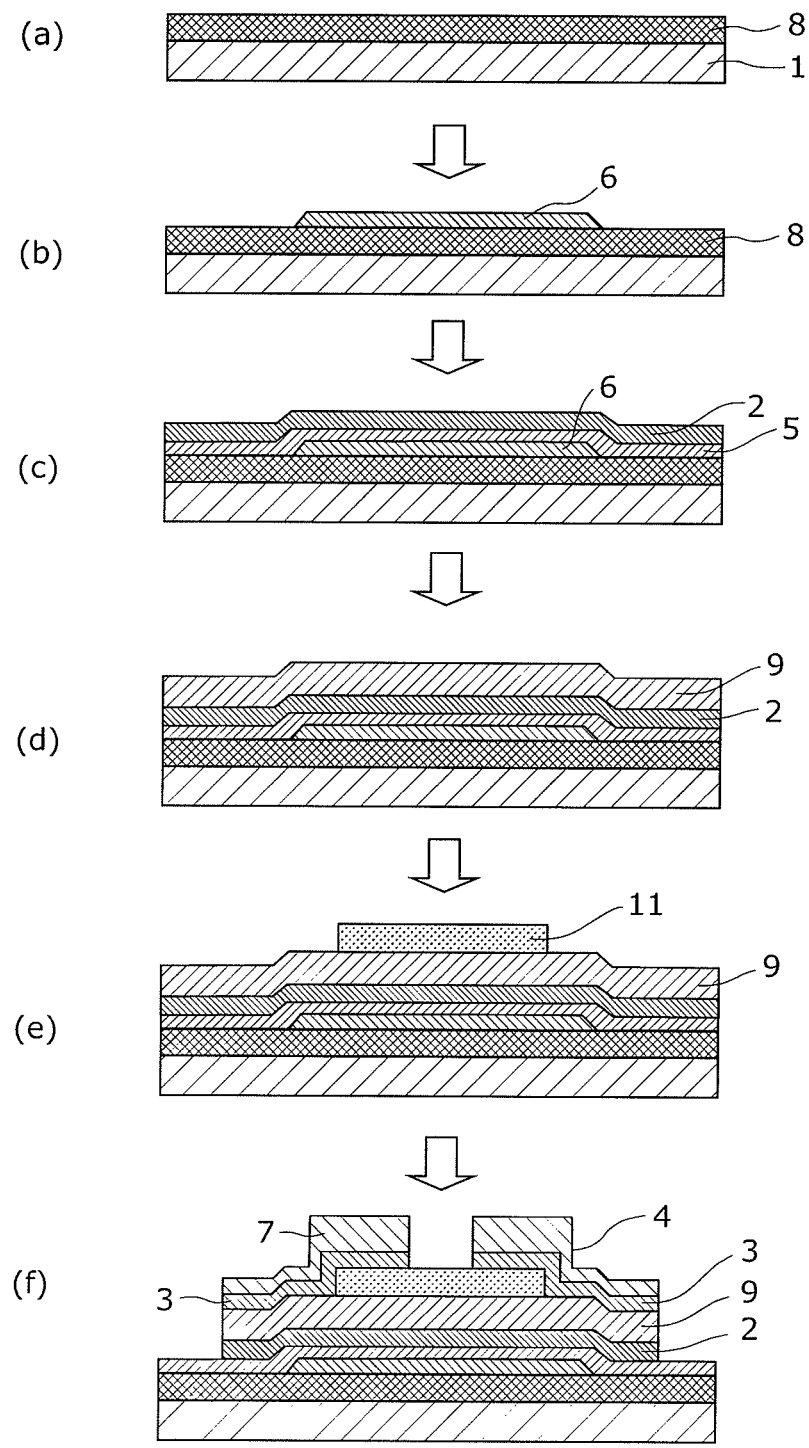
FIG. 22 is a cross-sectional view that schematically illustrates the configuration of respective processes in the method of manufacturing the second bottom-gate TFT 10B-B according to the exemplary embodiment.

First, the method of manufacturing the second bottom-gate TFT 10B-B according to the exemplary embodiment shall be described with reference to FIG. 22. FIG. 22 is a cross-sectional view that schematically illustrates the configuration of the second bottom-gate TFT 10B-B according to the exemplary embodiment.

First, as shown in (a) in FIG. 22, a glass substrate is prepared as the substrate 1. Next, before forming the gate electrode 6, the undercoat layer 8 made of a silicon nitride film or a silicon oxide film is formed on the substrate 1 by plasma CVD. It should be noted that, by combining the function of suppressing impurities from the glass substrate into a gate insulating film, the undercoat layer 8 need not be formed.

Next, as shown in (b) in FIG. 22, the gate electrode 6 is formed in a predetermined shape on the undercoat 8. For example, the gate electrode 6 having a predetermined shape can be formed by forming a gate metal film made of MoW on the undercoat layer 8 by sputtering, and patterning the gate metal film using the photolithography method or the etching method.

Next, as shown in (c) in FIG. 22, the gate insulating film 5 is formed covering the substrate 1 above which the gate electrode 6 is formed. For example, the gate insulating film 5 made of a silicon oxide is formed by plasma CVD, and so on, so as to cover the gate electrode 6.

Next, a non-crystalline silicon film made of amorphous silicon in which pseudo-crystal nuclei exist is formed on the gate insulating film 5, as a precursor film of the crystalline silicon film 2. The non-crystalline silicon film can be formed by plasma CVD, and so on, according to the above-described crystalline silicon film forming method according to the exemplary embodiment. The non-crystalline silicon film is formed consecutively in the same equipment, and, for example, in the same reaction chamber, as the gate insulating film 5. With this, it is possible to reduce impurity contamination in the interface between the gate insulating film 5 and the non-crystalline silicon film.

Next, the non-crystalline silicon film is crystallized by annealing the non-crystalline silicon film at a temperature of 500° C. to 1000° C., to form the crystalline silicon film 2. In the exemplary embodiment, the crystallization of the non-crystalline silicon film was performed by annealing for approximately 1 minute to several tens of hours using a rapid thermal annealing method. Furthermore, when a glass substrate is used as the substrate 1, it is preferable that annealing be performed at a temperature of 800° C. or lower in order to suppress damage to or distortion of the glass substrate. By adjusting the annealing temperature and the annealing time, the grain size of the crystalline silicon film 2 can be controlled. In addition, in order to prevent film damage due to bumping of hydrogen inside the non-crystalline silicon film when using an annealing method (for example, laser annealing, flash lamp annealing, etc.) which rapidly raises the temperature (>100° C./sec.), it is preferable that crystallization annealing be performed after performing dehydrogenation annealing at a temperature of 400° C. or higher which is the temperature at which hydrogen escapes from the non-crystalline silicon film.

Next, as shown in (d) in FIG. 22, the non-crystalline silicon layer 9 is formed on the crystalline silicon film 2. The non-crystalline silicon film 9 can be formed by plasma CVD and so on.

Here, for example, hydrogen plasma processing is performed on the crystalline silicon film 2 before stacking the non-crystalline silicon layer 9. With this hydrogen plasma processing, it is possible to obtain the advantageous effects of hydrogenating the crystalline silicon film 2, removing the natural oxide film formed on the crystalline silicon film 2, and improving the adhesion of the non-crystalline silicon layer 9. The hydrogen plasma processing is performed by generating hydrogen plasma using high-frequency power and a gas including hydrogen gas as a source material, and irradiating the crystalline silicon film 2 with the hydrogen plasma.

It should be noted that, in this hydrogen plasma processing, hydrogen plasma including hydrogen ions ($H^+$) and hydrogen radicals ($H^*$) is generated inside a plasma atmosphere, and through the penetration of the generated hydrogen ions and hydrogen radicals into the crystalline silicon film 2, the dangling bonds of the silicon atoms making up the crystalline silicon film 2 are hydrogen terminated.

Next, as shown in (e) in FIG. 22, the channel protecting film 11 having a predetermined shape is formed on the non-crystalline silicon layer 9. For example, the channel protecting film 11 having a predetermined shape can be formed by forming a channel protecting film made of an oxide silicon film on the non-crystalline silicon layer 9 by CVD, and patterning the channel protecting film using a photolithography method and a wet etching method. It should be noted that the process can be further simplified by using a solution-processable organic material or a photosensitive solution-processable application-type organic material to form the channel protecting film 11.

Next, a contact layer film which is to become the contact layer 3 is formed on the non-crystalline silicon layer 9 so as to cover the channel protecting film 11. For example, a contact layer film made of amorphous silicon doped with an impurity of a quinquevalent element such as phosphorus, and so on, is formed by plasma CVD. Here, before forming the contact layer film, the natural oxide film formed on the upper surface of the non-crystalline silicon layer 9 is removed by, for example, performing, on the non-crystalline silicon layer 9, dry etching using $CF_4$ or $O_2$ or wet etching using dilute hydrofluoric acid (DHF). In addition, by performing hydrogen plasma processing before forming the contact layer film, it is possible to improve the adhesion with the non-crystalline silicon layer 9 and remove the natural oxide film formed on the surface of the non-crystalline silicon layer 9.

Next, a source/drain metal film which is to become the source electrode 4 and the drain electrode 7 is formed on the contact layer film. For example, a source/drain metal film having a trilayer structure of MoW/Al/MoW is formed by sputtering.

Subsequently, in order to pattern the source electrode 4 and the drain electrode 7 of a predetermined shape, a resist material is applied onto the source/drain metal film, then exposed, and developed, to form a resist that is patterned in the predetermined shape.

Next, the source electrode 4 and the drain electrode 7 of the predetermined shape is formed, as shown in (f) in FIG. 22, by patterning the source/drain metal film by performing wet etching with the resist as a mask. It should be noted that, at this time, the contact layer film functions as an etching stopper. Subsequently, the resist is removed. With this, the source electrode 4 and the drain electrode 7 can be formed above the channel region of the crystalline silicon film 2.

Next, the contact layer film, the non-crystalline silicon layer 9, and the crystalline silicon film 2 are patterned by performing etching with the source electrode 4 and the drain electrode 7 as a mask. With this, it is possible to form the pair of contact layers 3 of a predetermined shape, and the non-crystalline silicon layer 9 and the crystalline silicon film 2 which are stacked in the shape of an island.

In this manner, it is possible to manufacture the second bottom-gate TFT 10B-B according to the exemplary embodiment.

As described above, according to the semiconductor device manufacturing method according to the exemplary embodiment, pseudo-crystal nuclei exist inside the non-crystalline silicon film which is the precursor film for forming the crystalline silicon film 2, and thus it is possible to reduce the activation energy of the crystallization in the crystallization annealing. Therefore, the grain size of the crystalline silicon film 2 can be made bigger than the grain size of the crystalline silicon film formed through the same crystallization annealing as in the conventional method. Consequently, it is possible to manufacture a semiconductor device capable of improving on-state current. As a result, it is possible to realize a TFT that can be used as a pixel circuit TFT of a high-definition display device or an organic EL display device, using a process that is simple and allows increase in size.

It should be noted that, in the first bottom-gate TFT 10B-A according to the exemplary embodiment shown in FIG. 21A, the channel protecting film 11 is not formed. As such, in the forming of the contact layers 3, time-controlled etching prevents the non-crystalline silicon layer 9 from being completely etched-out.

Furthermore, the third bottom-gate TFT 10B-C according to the exemplary embodiment shown in FIG. 21C and the fourth bottom-gate TFT 10B-D according to the exemplary embodiment shown in FIG. 21D can be manufactured by interchanging the sequence in the above described manufacturing method.

(Top-Gate TFT Configuration)

Four types are mainly used as top-gate TFTs. Hereinafter, the configurations of four types of top-gate TFTs according to the exemplary embodiment shall be described with reference to FIG. 23A to FIG. 23D.

Figure 23A:
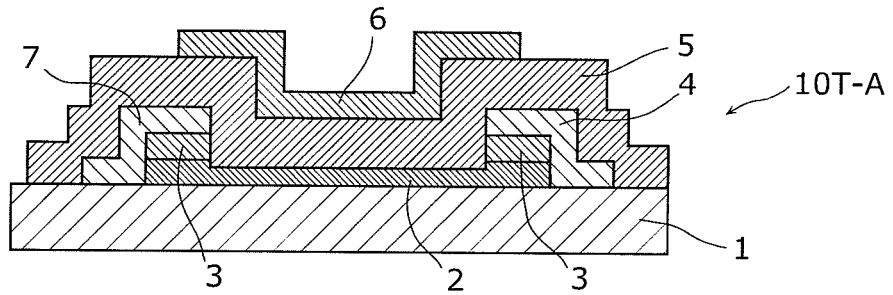
FIG. 23A is a cross-sectional view of a first top-gate TFT 10T-A according to the exemplary embodiment.

FIG. 23A is a cross-sectional view that schematically illustrates the configuration of a first top-gate TFT 10T-A according to the exemplary embodiment.

As shown in FIG. 23A, the first top-gate TFT 10T-A includes: the substrate 1; the crystalline silicon film 2 formed on the substrate 1; the source electrode 4 formed above one end region of the crystalline silicon film 2; the drain electrode 7 formed above the other end region of the crystalline silicon film 2; the gate insulating film 5 formed on the source electrode 4, the drain electrode 7, and the crystalline silicon film 2 in between the source electrode 4 and the drain electrode 7; and the gate electrode 6 formed on the gate insulating film 5. The crystalline silicon film 2 is formed according to the crystalline silicon film forming method according to the exemplary embodiment, described above.

In addition, the first top-gate TFT 10T-A includes the pair of contact layers 3 formed between the one end region of the crystalline silicon film 2 and the source electrode 4 and between the other end region of the crystalline silicon film 2 and the drain electrode 7.

Figure 23B:
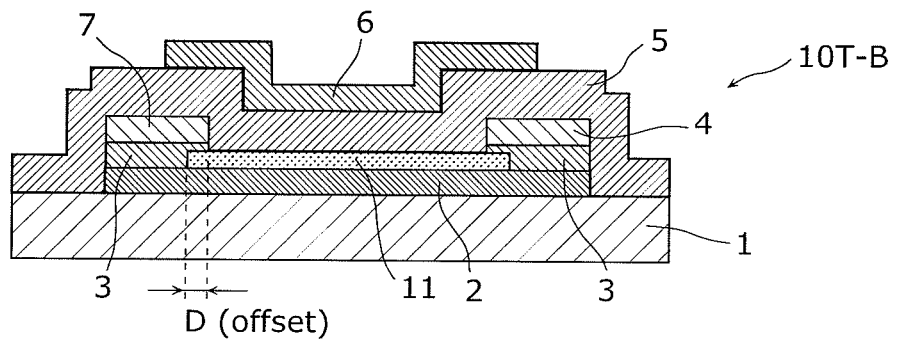
FIG. 23B is a cross-sectional view of a second top-gate TFT 10T-B according to the exemplary embodiment.

FIG. 23B is a cross-sectional view that schematically illustrates the configuration of a second top-gate TFT 10T-B according to the exemplary embodiment.

As shown in FIG. 23B, the second top-gate TFT 10T-B includes, in the same manner as the first top-gate TFT 10T-A in FIG. 23A: the substrate 1; the crystalline silicon film 2, the pair of the contact layers 3, the pair of the source electrode 4 and the drain electrode 7, the gate insulating film 5, and the gate electrode 6 that are formed above the substrate 1.

In the second top-gate TFT 10T-B, the channel protecting layer 11 is further formed on the crystalline silicon film 2. Both ends of the channel protecting layer 11 are formed so as to be interposed between the source electrode 4 (or the drain electrode 7) and the crystalline silicon film 2, and part of the source electrode 4 (or the drain electrode 7) and the channel protecting layer 11 overlap each other in a direction perpendicular to the substrate.

The width of the overlap between the source electrode 4 (or the drain electrode 7) and the channel protecting layer 11 is called offset width D. Each of the regions of the crystalline silicon film 2 corresponding to the offset width D is an offset region to which the gate voltage is not applied. Because the gate voltage is not applied, the offset region becomes a high-resistance region in which a channel region is not formed.

Figure 23C:
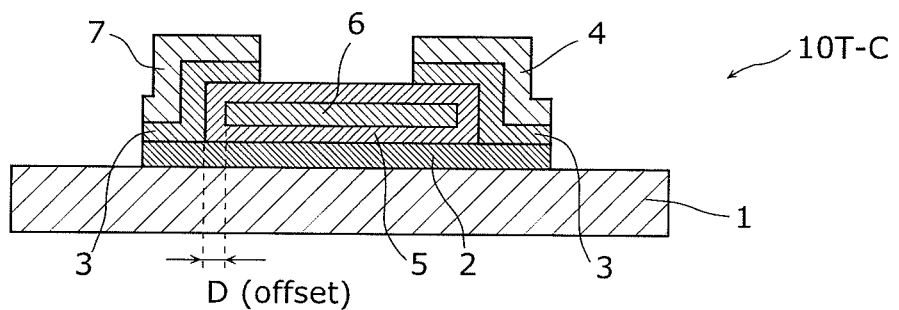
FIG. 23C is a cross-sectional view of a third top-gate TFT 10T-C according to the exemplary embodiment.

FIG. 23C is a cross-sectional view that schematically illustrates the configuration of a third top-gate TFT 10T-C according to the exemplary embodiment.

As shown in FIG. 23C, the third top-gate TFT 10T-C includes: the substrate 1; the crystalline silicon film 2 formed above the substrate 1; and the gate electrode 6 which is surrounded by the gate insulating film 5 formed above the crystalline silicon film 2. Furthermore, the pair of contact layers 3 are formed on both ends of the crystalline silicon film 2 via the gate insulating film 5, and the source electrode 4 and the drain electrode 7 are formed over the pair of contact layers 3.

In FIG. 23C, the width of the gate insulating film 5 formed at both ends of the gate electrode 6 is the offset width D. Each of the regions of the crystalline silicon film 2 corresponding to the offset width D is an offset region.

Figure 23D:
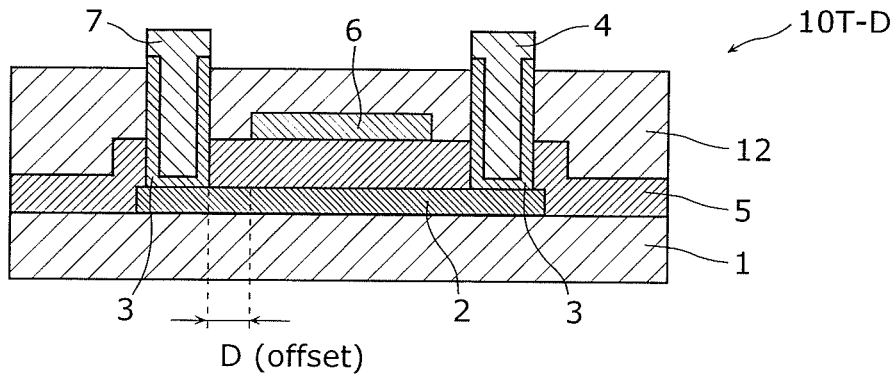
FIG. 23D is a cross-sectional view of a fourth top-gate TFT 10T-D according to the exemplary embodiment.

FIG. 23D is a cross-sectional view that schematically illustrates the configuration of a fourth top-gate TFT 10T-D according to the exemplary embodiment.

As shown in FIG. 23D, the fourth top-gate TFT 10T-D includes: the substrate 1; the crystalline silicon film 2, the gate insulating film 5, and the gate electrode 6 which are formed above the substrate 1; and an insulating layer 12 formed on the gate insulating film 5 and the gate electrode 6. Furthermore, contact holes connected to the crystalline silicon film 2 are formed in the gate insulating film 5 and the insulating layer 12. The source electrode 4 and the drain electrode 7 are formed inside the contact holes and reaching above the insulating layer 12, via the contact layers 3 formed inside the contact holes.

Furthermore, in FIG. 23D, the crystalline silicon film 2 between the source electrode 4 and the drain electrode 7, above which the gate electrode 6 is not formed is the offset region, and the width between one of the contact layers 3 and the gate electrode 6 becomes the offset width D.

As described above, among the four types of top-gate TFTs shown in FIG. 23A to FIG. 23D, the second top-gate TFT 10T-B, the third top-gate TFT 10T-C, and the fourth top-gate TFT 10T-D each have a high-resistance region which is the offset region. Therefore, these three types of top-gate TFTs have the disadvantage that carrier mobility decreases and cost becomes high due to the increased number of masks in the manufacturing process.

For example, a TFT to be used in an active-matrix substrate for a display device has high carrier mobility and allows manufacturing with a small number of masks. Accordingly, in order to realize this, the first top-gate TFT 10T-A in which an offset region is not formed is effective.

Hereinafter, the first top-gate TFT 10T-A according to the exemplary embodiment shall be described in detail with reference to the Drawings.

As shown in FIG. 23A, the first top-gate TFT 10T-A according to the exemplary embodiment includes: the substrate 1; the crystalline silicon film 2 as a channel layer; the contact layers 3, the source electrode 4; the drain electrode 7; the gate insulating film 5; and the gate electrode 6.

The substrate 1 is, for example, a glass substrate made of a glass material such as quartz glass, alkali-free glass, highly heat-resistant glass, and so on.

The crystalline silicon film 2 is formed in the shape of an island, above the substrate 1. It should be noted that the above-described undercoat layer 8 may be formed between the substrate 1 and crystalline silicon film 2. The crystalline silicon film 2 in the exemplary embodiment is a polycrystalline silicon film formed by crystallizing the amorphous silicon film which is the precursor film in which pseudo-crystal nuclei exist and which is formed using the above-described forming method. This polycrystalline silicon film has a mixed-crystal structure of amorphous silicon and crystalline silicon. It should be noted that, for example, in order to obtain excellent on-characteristics, at least a predetermined channel region of the crystalline silicon film 2 is configured of a film having a large percentage of crystalline silicon. The thickness of the crystalline silicon film 2 is, for example, approximately 20 to 100 nm, and the grain size of the crystalline silicon inside the crystalline silicon film 2 is, for example, approximately 5 to 1000 nm. Furthermore, since volume generally changes due to expansion when the structure changes from non-crystalline to crystalline, the effect of protrusions formed on the surface of the crystalline silicon film increases when the grain size of the crystalline silicon increases. In the case of a top-gate TFT, the gate insulating film 5 is formed on the upper surface of the crystalline silicon film 2, and because carriers move in the interface thereof, the effect of protrusions on the device characteristics becomes more noticeable. In order to reduce the effects of these protrusions, it is preferable that the grain size of the crystalline silicon be 300 nm or less.

The upper surface and the side surface of each end of the crystalline silicon film 2 are electrically connected to the corresponding one of the source electrode 4 and the drain electrode 7 via the contact layers 3.

The contact layers 3 are amorphous silicon layers that are doped with an impurity. The contact layers 3 in the exemplary embodiment are n-type semiconductor layers formed by doping phosphorous (P) in an amorphous silicon film as an impurity, and are single-layer n$^+$ layers including a high concentration of impurity. Here, high concentration means including not less than $1 \times 10^{19}$ [atm/cm$^3$] of impurity. It should be noted that it is preferable that the thickness of the contact layers 3 be sufficient to secure the desired carriers, that is, be not less than 10 nm, and more preferably be not less than 15 nm.

The source electrode 4 and the drain electrode 7 are in ohmic contact with the contact layers 3, and each is formed on the upper surface of a corresponding one of the contact layers 3. Furthermore, the source electrode 4 and the drain electrode 7 are formed to have level side surfaces with the contact layers 3. It should be noted that, as a material of the source electrode 4 and the drain electrode 7, it is possible to use, for example, a molybdenum (Mo) and tungsten (W) alloy, copper (Cu), Mo, Al, or an Al and Cu alloy.

The gate insulating film 5 is made of an insulating material such as a silicon oxide film (SiO$_X$), and is formed on the crystalline silicon film 2 that is not covered by the contact layers 3, and on the source electrode 4 and the drain electrode 7.

The gate electrode 6 is formed on the gate insulating film 5, and is formed at least above the crystalline silicon film 2 that is not covered by the contact layers 3. In other words, the gate electrode 6 is formed above the crystalline silicon film 2 so that the gate insulating film 5 is interposed therebetween. As the material of the gate electrode 6, it is possible to use, for example, a Mo and W alloy, Cu, Mo, Al, or an Al and Cu alloy.

As described above, according to the semiconductor device according to the exemplary embodiment, the crystalline silicon film 2 which is a channel layer is formed having, as a precursor film, a non-crystalline silicon film in which pseudo-crystal nuclei exist inside the film, and thus it is possible to reduce the activation energy of the crystallization in the crystallization annealing. Therefore, the grain size of the crystalline silicon film 2 in the exemplary embodiment can be made bigger than the grain size of the crystalline silicon film formed through the same crystallization annealing as in the conventional method. Accordingly, the semiconductor device according to the exemplary embodiment allows improvement of on-state current compared to the conventional semiconductor device. As a result, it is possible to realize a top-gate TFT that can be used as a pixel circuit TFT of a high-definition display device or an organic EL display device.

(Top-Gate TFT Manufacturing Method)

Figure 24:
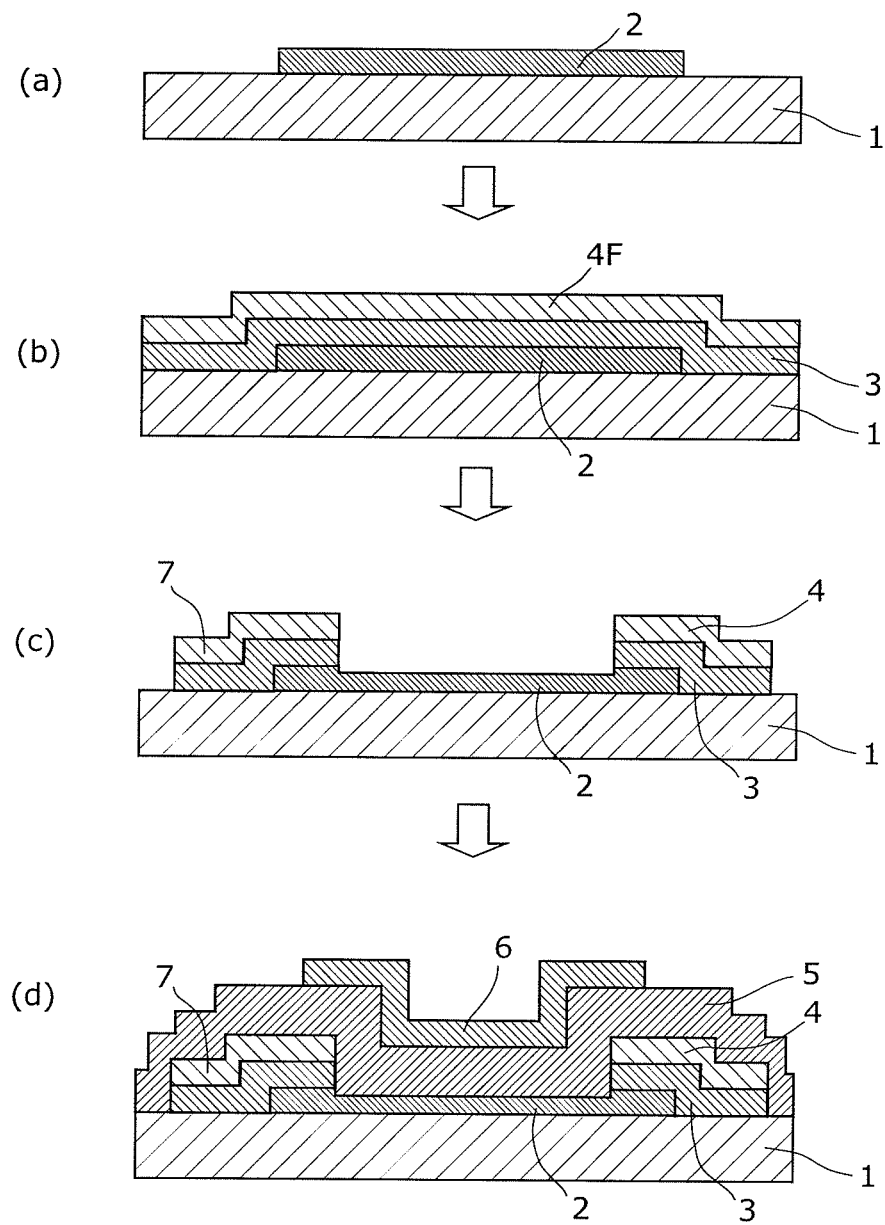
FIG. 24 is a cross-sectional view that schematically illustrates the configuration of respective processes in the method of manufacturing the first top-gate TFT 10T-A according to the exemplary embodiment.

Next, the method of manufacturing the first top-gate TFT 10T-A according to the exemplary embodiment shall be described with reference to FIG. 24. FIG. 24 is a cross-sectional view that schematically illustrates the configuration of the first top-gate TFT 10T-A according to the exemplary embodiment.

First, as shown in (a) in FIG. 24, a glass substrate is prepared as the substrate 1. It should be noted that, before forming the non-crystalline silicon film which is the precursor film of the crystalline silicon film 2, an undercoat layer made of a silicon nitride film or a silicon oxide film may be formed on the substrate 1 by plasma CVD and so on. It should be noted that, by combining the function of suppressing impurities from the glass substrate into a gate insulating film, the undercoat layer need not be formed.

Next, a non-crystalline silicon film in which pseudo-crystal nuclei exist is formed on the substrate 1, as a precursor film of the crystalline silicon film 2. The non-crystalline silicon film can be formed by plasma CVD and so on, according to the above-described crystalline silicon film forming method according to the exemplary embodiment.

Next, the non-crystalline silicon film is crystallized by annealing the non-crystalline silicon film at a temperature of 500° C. to 1000° C., to form the crystalline silicon film 2. In the exemplary embodiment, the crystallization of the non-crystalline silicon film was performed by annealing for approximately 1 minute to several tens of hours using a rapid thermal annealing method. Furthermore, when a glass substrate is used as the substrate 1, it is preferable that annealing be performed at a temperature of 800° C. or lower in order to suppress damage to or distortion of the glass substrate. By adjusting the annealing temperature and the annealing time, the grain size of the crystalline silicon film 2 can be controlled. In addition, in order to prevent film damage due to bumping of hydrogen inside the non-crystalline silicon film when using an annealing method (for example, laser annealing, flash lamp annealing, etc.) which rapidly raises the temperature (>100° C./sec.), it is preferable that crystallization annealing be performed after performing dehydrogenation annealing at a temperature of 400° C. or higher which is the temperature at which hydrogen escapes from the non-crystalline silicon film.

Subsequently, as shown in (a) in FIG. 24, the crystalline silicon film 2 is patterned into an island-shape. With this, a channel layer made from the crystalline silicon film 2 can be formed on the substrate 1.

Next, as shown in (b) in FIG. 24, an impurity-doped amorphous silicon film which is to become the contact layers 3 is formed on the upper surface of the substrate 1 and the upper surface of the crystalline silicon film 2, by CVD. For the impurity, for example, a quinquevalent element such as phosphorous can be used.

Next, a metal film 4F which is to become the source electrode 4 and the drain electrode 7 is formed on the impurity-doped amorphous silicon film. The metal film 4F can be formed by sputtering, vapor deposition, or CVD. As described earlier, Mo, Cu, Al, and so on, is used as the material of the metal film 4F.

Next, a resist is formed on the upper surface of the metal film 4F by applying a predetermined resist material. A mask is placed above the resist. The mask is for patterning the metal film 4F to form the source electrode 4 and the drain electrode 7, and is formed corresponding to the metal film 4F which is to become the source electrode 4 and the drain electrode 7. Specifically, the mask is placed above the resist so as to straddle the boundary region between a predetermined region which is the region on the substrate 1 above which the crystalline silicon film 2 is formed and a region (region other than the predetermined region) on the substrate 1 above which the crystalline silicon film 2 is not formed.

Subsequently, the resist is exposed via the mask, and the exposed resist is removed. With this, the resist in the region other than the region corresponding to the mask is removed and the resist in the regions opposite the mask is left remaining. This makes it possible to leave the resist only on the regions of the metal film 4F which are to become the source electrode 4 and the drain electrode 7. At this time, the metal film 4F other than the regions which are to become the source electrode 4 and the drain electrode 7 is exposed.

Next, the exposed metal film 4F is removed by etching using wet etching, with the remaining resist as a mask. As shown in (c) in FIG. 24, this allows the formation of the source electrode 4 and the drain electrode 7 which have a predetermined shape. It should be noted that, for the etching, a compound liquid of phosphoric acid, nitric acid, and acetic acid, and so on, can be used when the metal film 4F is an aluminum (Al) and copper (Cu) alloy, for example.

Next, the contact layers 3 can be patterned by removing, through etching using dry etching, the contact layers 3 exposed by the removal of the metallic film 4F.

At this time, the dry etching of the contact layers 3 is performed above the substrate 1 on which the crystalline silicon film 2 is not formed, until the substrate 1 is exposed. In this case, since the thickness of the contact layers 3 on the predetermined region of the substrate 1 (the region on which the crystalline silicon film 2 is not formed) and the thickness of the contact layers 3 formed on the regions other than the predetermined region of the substrate 1 (the regions of the substrate 1 on which the crystalline silicon film 2 is not formed) are the same, the crystalline silicon film 2 is also exposed at the same time as the exposure of the substrate 1.

Next, after the resist is removed, the gate insulating film 5 made of $SiO_2$, and so on, is formed by CVD as shown in (d) in FIG. 24.

Subsequently, as shown in the figure, a metal film which is to become the gate electrode 6 is formed on the gate insulating film 5 by sputtering, and the gate electrode 6 of a predetermined shape is formed by patterning and etching.

In this manner, it is possible to manufacture the first top-gate TFT 10T-A according to the exemplary embodiment.

As described above, according to the semiconductor device manufacturing method according to the exemplary embodiment, pseudo-crystal nuclei exist inside the non-crystalline silicon film which is the precursor film for forming the crystalline silicon film 2, and thus it is possible to reduce the activation energy of the crystallization in the crystallization annealing. Therefore, the grain size of the crystalline silicon film 2 in the exemplary embodiment can be made bigger than the grain size of the crystalline silicon film formed through the same crystallization annealing as in the conventional method. Consequently, it is possible to manufacture a semiconductor device capable of improving on-state current. As a result, it is possible to realize a top-gate TFT that can be used as a pixel circuit TFT of a high-definition display device or an organic EL display device, using a process that is simple and allows increase in size.

It should be noted that the second to fourth top-gate TFTs 10T-B, 10T-C, and 10T-D shown in FIG. 23B to FIG. 23D can be easily manufactured by interchanging the process sequence or combining existing processes based on the above-described manufacturing methods.

(Working Example of Bottom-Gate TFT)

Next, a TFT which uses, as a channel layer, the crystalline silicon film formed according to the crystalline silicon film forming method according to the exemplary embodiment and a TFT which uses, as a channel layer, a crystalline silicon film formed according to a conventional crystalline silicon film forming method are manufactured, and TFT characteristics are compared.

Figure 25A:
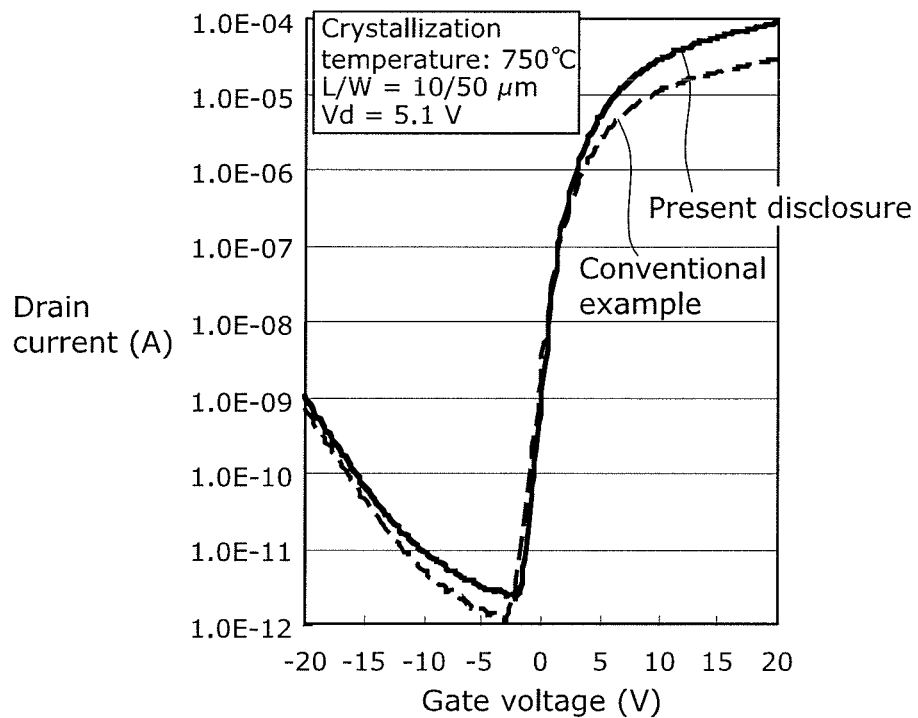
FIG. 25A is a graph showing the transfer characteristics of a bottom-gate TFT which uses, as a channel layer, the crystalline silicon film according to the exemplary embodiment shown in FIG. 15C and the transfer characteristics of a bottom-gate TFT which uses, as a channel layer, the conventional crystalline silicon film shown in FIG. 30B.

First, the transfer characteristics of the TFTs shall be described with reference to FIG. 25A. FIG. 25A is a graph showing (i) the transfer characteristics of a bottom-gate TFT (the TFT according to the present disclosure) which uses, as a channel layer, the crystalline silicon film according to the exemplary embodiment shown in FIG. 15C and (ii) the transfer characteristics of the bottom-gate TFT (a conventional TFT) which uses, as a channel layer, the conventional crystalline silicon film shown in FIG. 30B.

It should be noted that the precursor film for forming the crystalline silicon film according to the exemplary embodiment was formed using condition 3 (Ar gas dilution) shown in FIG. 10, and the precursor film for forming the conventional crystalline silicon film was formed using condition 4 (hydrogen gas dilution) shown in FIG. 10. Furthermore, the crystallization temperature of the precursor films was set at 750° C. Moreover, the gate length (L) and the gate width (W) of the manufactured TFTs are 10 μm and 50 μm, respectively. Furthermore, the drain voltage to be applied was set to 5.1 V.

As shown in FIG. 25A, it can be seen that the TFT according to the present disclosure has improved on-characteristics compared to the conventional TFT. Furthermore, based on the transfer characteristics shown in FIG. 25A, the carrier mobility of the TFT according to the present disclosure was approximately 6.7 [$cm^2/Vs$].

Figure 25B:
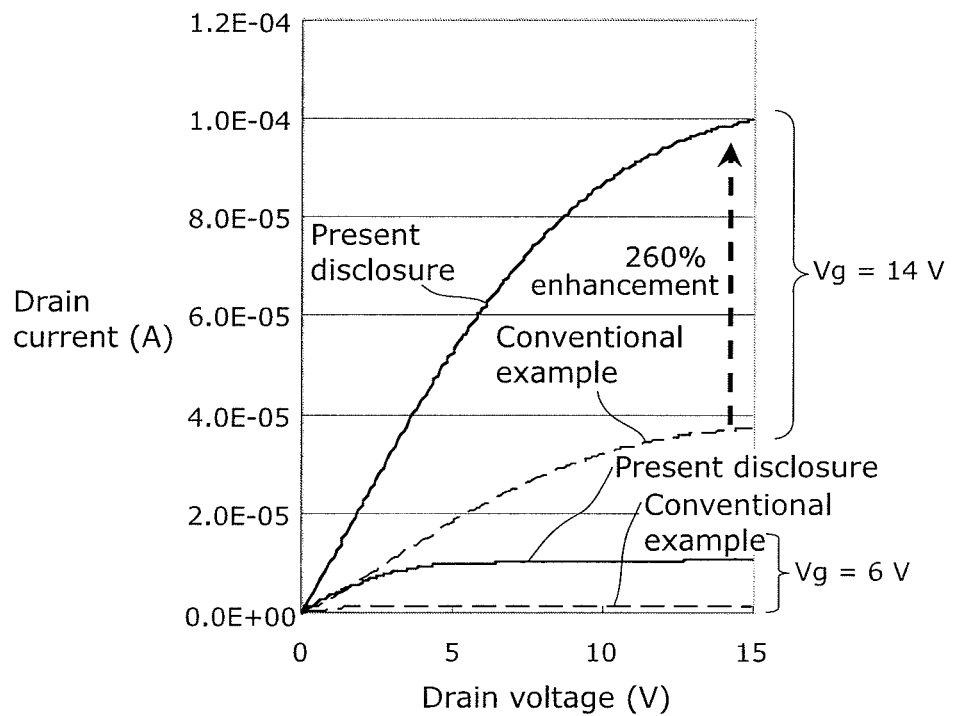
FIG. 25B is a graph showing the drain current-drain voltage electrical characteristics of the bottom-gate TFT which uses, as a channel layer, the crystalline silicon film according to the exemplary embodiment shown in FIG. 15C and the drain current-drain voltage electrical characteristics of the bottom-gate TFT which uses, as a channel layer, the conventional crystalline silicon film shown in FIG. 30B.

Next, the electrical characteristics of the TFTs shall be described with reference to FIG. 25B. FIG. 25B is a graph showing (i) the drain current-drain voltage electrical characteristics of the bottom-gate TFT (the TFT according to the present disclosure) which uses, as a channel layer, the crystalline silicon film according to the exemplary embodiment shown in FIG. 15C and (ii) the drain current-drain voltage electrical characteristics of the bottom-gate TFT (a conventional TFT) which uses, as a channel layer, the conventional crystalline silicon film shown in FIG. 30B.

As shown in FIG. 25B, it can be seen that, whether the gate voltage is 6 V or 14 V, the TFT according to the present disclosure has an enhanced saturation drain current compared to the conventional TFT. In particular, it can be seen that, when the gate voltage is 14 V, the TFT according to the present disclosure can obtain a saturation drain current that is 2.6 times that of the conventional TFT.

Figure 26:
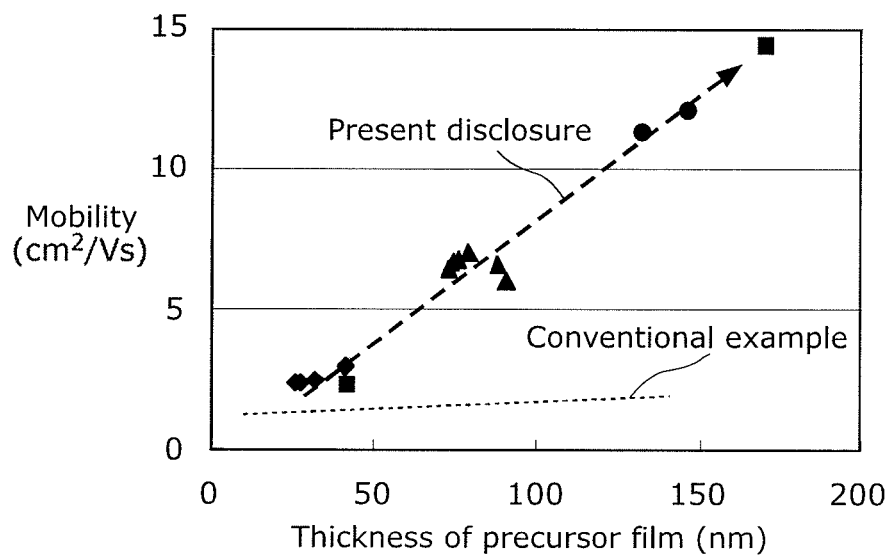
FIG. 26 is a diagram showing the precursor film thickness dependence of the carrier mobility of the TFT according to the present disclosure and the conventional TFT.

Next, the precursor film thickness dependence of the carrier mobility of the TFTs shall be described. FIG. 26 is a diagram showing the precursor film thickness dependence of the carrier mobility of the TFT according to the present disclosure and the conventional TFT. Here, the precursor film was formed under condition 3, and for the crystallization annealing, processing was performed for 20 minutes at 750° C. As shown in FIG. 26, it can be seen that, with the TFT according to the present disclosure, the carrier mobility of the TFT increases together with the increase in the thickness of the precursor film. This is because, as previously described, the average grain size of the crystalline silicon film increases together with the increase in precursor film thickness. On the other hand, with the conventional TFT which uses a silicon film having the conventional short-time SPC morphology, the crystal grain size virtually does not change according to the thickness of the precursor film, and thus dependence of carrier mobility on the thickness of the precursor film is almost unobservable.

It should be noted that, for the device structure of the TFT in this working example, the structure in FIG. 21A in which the difference in crystallinity can be most clearly observed is used.

As described above, it was verified that despite having the same crystallization condition (the same crystallization temperature and the same crystallization time), the same TFT structure, and the same TFT manufacturing processes, the TFT according to the present disclosure can realize on-characteristics approximately 2.5 times that of the conventional TFT.

(Display Device)

Next, an example in which the semiconductor device according to the exemplary embodiment is applied to the display device shall be described with reference to FIG. 27. It should be noted that, in the exemplary embodiment, an example of an application to an organic EL display device shall be described.

Figure 27:
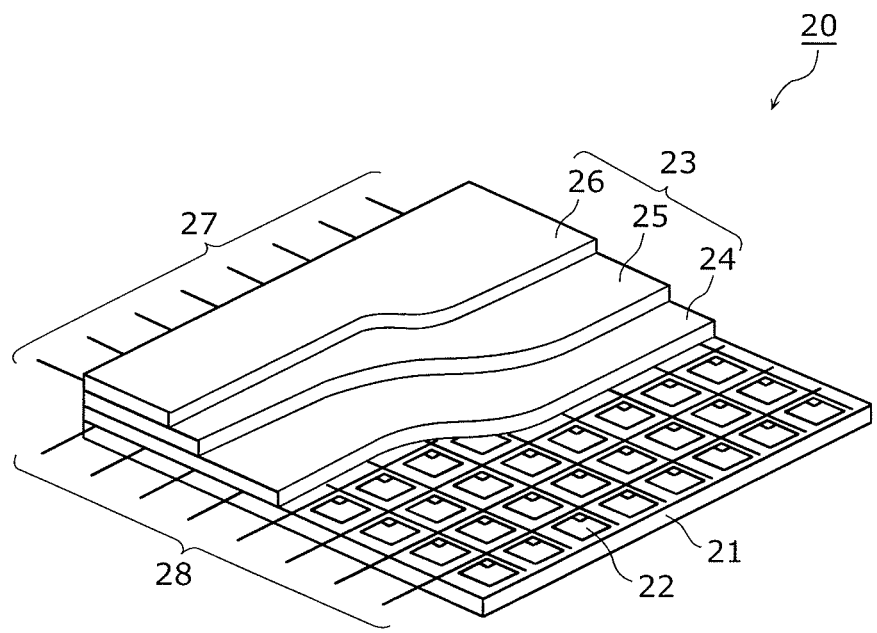
FIG. 27 is a partial cutout perspective view of an organic EL display device in the exemplary embodiment.

FIG. 27 is a partial cutout perspective view of an organic EL display device in the exemplary embodiment. The semiconductor device configured in the above-described manner can be used as a switching transistor or a driving transistor in an active-matrix substrate of the organic EL display device, and is used as a driving transistor 31 in the exemplary embodiment.

As shown in FIG. 27, an organic EL display device 20 includes: an active-matrix substrate 21; pixels 22 arranged in a matrix on the active-matrix substrate 21; organic EL elements 23 that are formed to correspond to the respective pixels 22; scanning lines (gate lines) 27 formed along the row direction of the pixels 22; video signal lines (source lines) 28 formed along the column direction of the pixels 22; and power source lines 29 (not shown in the figure) formed parallel to the video signal lines 28. Each of the organic EL elements 23 includes an anode electrode 24, an organic EL layer 25, and a cathode electrode 26 (transparent electrode) which are sequentially stacked above the active-matrix substrate 21. It should be noted that, in actuality, plural anode electrodes 24 are formed for each pixel 22. Furthermore, the organic EL layer 25 is configured by stacking the respective layers of an electron transport layer, a light-emitting layer, a hole transport layer, and so on.

Figure 28:
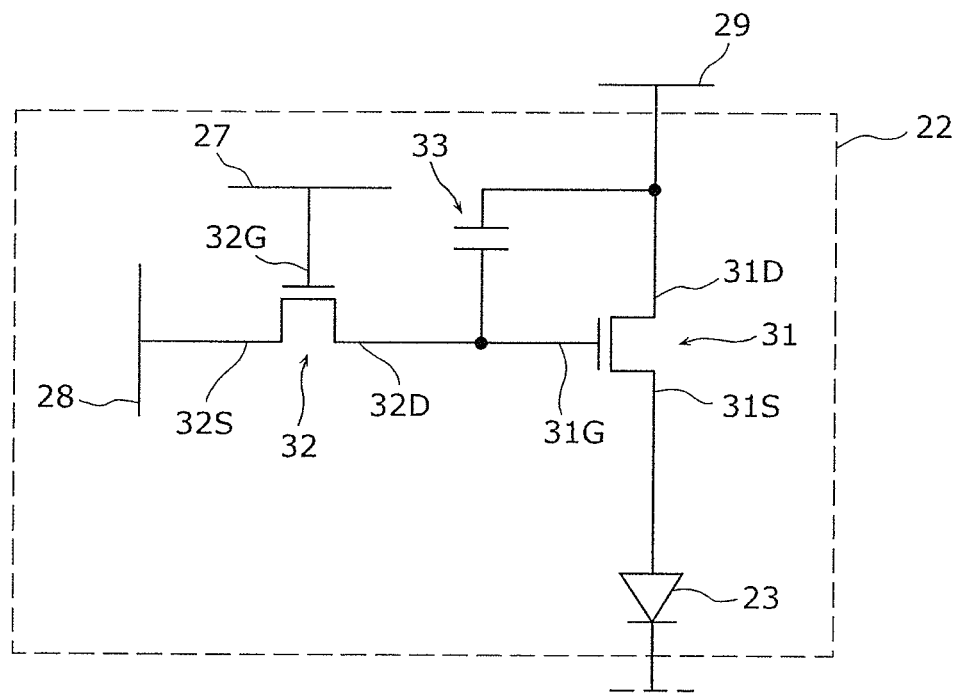
FIG. 28 is a diagram showing the circuit configuration of a pixel using the semiconductor device according to the exemplary embodiment.

Next, the circuit configuration of each pixel 22 in the organic EL display device 20 shall be described with reference to FIG. 28. FIG. 28 is a diagram showing the circuit configuration of a pixel using the thin-film semiconductor device according to the exemplary embodiment.

As shown in FIG. 28, the respective pixels 22 are partitioned by the scanning lines 27 and the video signal lines 28 which cross each other, and include a driving transistor 31, a switching transistor 32, a capacitor 33, and the organic EL element 23. The driving transistor 31 is a transistor for driving the organic EL element 23, and the switching transistor 32 is a transistor for selecting the pixel 22.

In the driving transistor 31, a gate electrode 31G is connected to a drain electrode 32D of the switching transistor 32; a source electrode 31S is connected to the anode of the organic EL element 23 via a relay electrode (not shown in the figure); and a drain electrode 31D is connected to the power source line 29.

Furthermore, in the switching transistor 32, a gate electrode 32G is connected to the scanning line 27; a source electrode 32S is connected to the video signal line 28; and a drain electrode 32D is connected to the capacitor 33 and the gate electrode 31G of the driving transistor 31.

In this configuration, when a gate signal is input to the scanning line 27 and the switching transistor 32 turns ON, the video signal voltage supplied via the video signal line 28 is written into the capacitor 33. Then, the video signal voltage which is written into the capacitor 33 is held through one frame period. This video signal voltage causes analog change in conductance of the driving transistor 31, so that drive current corresponding to luminescence gradation flows from anode to cathode of the organic EL element 23, and the organic EL element 23 emits light. With this, an image is displayed.

It should be noted that although the organic EL display device using the organic EL element was described in the exemplary embodiment, the present disclosure can also be applied to a display device including another display device in which an active-matrix substrate is used, such as a liquid crystal display device, and so on.

Furthermore, such display devices can be used as a flat panel display, and can be applied to electronic devices using various display units, such as a television set, a personal computer, a cellular phone, and so on.

Although semiconductor thin film forming methods, semiconductor devices, semiconductor device manufacturing methods, substrates, and thin-film substrates according to the present disclosure have been described thus far based on the exemplary embodiment, the present disclosure is not limited to the above-described embodiment.

For example, the thin-film substrate and so on according to the present disclosure can be used in electronic devices using a crystalline silicon film, for example, devices such as a thin-film solar battery, a contact image sensor, a light-emitting device, a ballistic electron emitter, and so on.

Furthermore, the crystalline silicon film in the thin-film substrate, and so on, according to the present disclosure may be a p-type semiconductor or an n-type semiconductor.

Moreover, embodiments obtained through various modifications to the exemplary embodiment which may be conceived by a person skilled in the art as well as embodiments realized by arbitrarily combining the structural elements and functions of the exemplary embodiment without materially departing from the principles and spirit of the present disclosure are included in the present disclosure.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The present disclosure can be widely applied in display devices such as a television set, a personal computer, and a cellular phone, or various electronic devices that include a semiconductor thin-film or a semiconductor device.

The invention claimed is:

1. A semiconductor thin-film manufacturing method comprising:
forming an amorphous silicon film above a substrate, the amorphous silicon film having a photoluminescence (PL) intensity greater than or equal to 0.65 when photon energy is 1.1 eV in a PL spectrum normalized to have a maximum PL intensity of 1, the amorphous silicon film including pseudo-crystal nuclei with an average grain size of at most 1 nm, the amorphous silicon film further including a pseudo-crystal nucleus region in which a density of bonds between atoms having an amorphous structure is less than a density of bonds between atoms having a pseudo-crystal structure;
annealing the amorphous silicon film; and
inducing, during the annealing, crystallization by solid phase crystallization to form a crystalline silicon film.

2. The semiconductor thin-film manufacturing method according to claim 1,
wherein, in the forming, the PL intensity when the photon energy is 1.1 eV in the normalized PL spectrum is less than or equal to 0.8.

3. The semiconductor thin-film manufacturing method according to claim 1,
wherein, in the forming, the amorphous silicon film includes Si-Si bond regions as the pseudo-crystal nuclei, and
in the annealing, the annealing crystallizes the amorphous silicon film with the pseudo-crystal nuclei as nuclei, to form the crystalline silicon film.

4. The semiconductor thin-film manufacturing method according to claim 3,
wherein the average grain size of the pseudo-crystal nuclei is smaller than or equal to an average critical crystal nucleus size.

5. The semiconductor thin-film manufacturing method according to claim 1,
wherein the substrate is a glass substrate.

6. The semiconductor thin-film manufacturing method according to claim 5,
wherein the annealing is performed at a temperature lower than or equal to a melting point of glass.

7. The semiconductor thin-film manufacturing method according to claim 1,
wherein an average grain size of crystals in the crystalline silicon film is in a range from 30 nm to 300 nm.

8. The semiconductor thin-film manufacturing method according to claim 1,
wherein, in the forming, the amorphous silicon film is formed by plasma processing under a forming condition that plasma density is in a range from 0.1 W/cm$^2$ to 0.5 W/cm$^2$.

9. The semiconductor thin-film manufacturing method according to claim 1,
wherein, in the forming, a crystal growth temperature of the amorphous silicon film is in a range from 350° C. to 500° C.

10. The semiconductor thin-film manufacturing method according to claim 1,
wherein, in the forming, the amorphous silicon film is formed using a source gas and an inert gas.

11. The semiconductor thin-film manufacturing method according to claim 10,
wherein, in the forming, the source gas includes any one of silane gas, disilane gas, and trisilane gas.

12. The semiconductor thin-film manufacturing method according to claim 10,
wherein, in the forming, the inert gas includes argon gas.

13. The semiconductor thin-film manufacturing method according to claim 1, wherein the amorphous silicon film includes the pseudo-crystal nucleus region in which a density of bonds between atoms that are bonded in a diamond bond structure is greater than a density of bonds between atoms having the amorphous structure.

14. The semiconductor thin-film manufacturing method according to claim 1,
a number of the pseudo-crystal nucleus region produces a PL intensity greater than or equal to 0.65 and less than or equal to 0.8 when photon energy is 1.1 eV in a PL spectrum normalized to have a maximum PL intensity of 1.

* * * * *